(12) United States Patent
Kim et al.

(10) Patent No.: US 8,816,432 B2
(45) Date of Patent: Aug. 26, 2014

(54) SEMICONDUCTOR DEVICES INCLUDING A VERTICAL CHANNEL TRANSISTOR AND METHODS OF FABRICATING THE SAME

(75) Inventors: Sua Kim, Seongnam-si (KR); Jin Ho Kim, Uiwang-si (KR); Chulwoo Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 64 days.

(21) Appl. No.: 13/586,018

(22) Filed: Aug. 15, 2012

(65) Prior Publication Data

US 2013/0099305 A1    Apr. 25, 2013

(30) Foreign Application Priority Data

Oct. 19, 2011  (KR) .................. 10-2011-0106857

(51) Int. Cl.
   *H01L 29/66*   (2006.01)
(52) U.S. Cl.
   USPC ........... 257/331; 257/329; 257/330; 257/332; 257/334; 257/E29.131; 438/262
(58) Field of Classification Search
   USPC .................. 257/329, 330, 331, 332, 333, 334; 438/262
   See application file for complete search history.

(56) References Cited

U.S. PATENT DOCUMENTS

| 5,072,269 | A | * | 12/1991 | Hieda | 257/302 |
| 5,719,422 | A | * | 2/1998 | Burr et al. | 257/336 |
| 6,004,848 | A | * | 12/1999 | Shone | 438/278 |
| 6,720,216 | B2 | * | 4/2004 | Forbes | 438/257 |
| 7,109,544 | B2 | | 9/2006 | Schloesser et al. | |
| 7,262,089 | B2 | | 8/2007 | Abbott et al. | |
| 2006/0249770 | A1 | | 11/2006 | Huo et al. | |
| 2008/0242025 | A1 | * | 10/2008 | Kim et al. | 438/262 |
| 2012/0146136 | A1 | * | 6/2012 | Park | 257/331 |
| 2013/0043525 | A1 | * | 2/2013 | Yu et al. | 257/329 |
| 2013/0056812 | A1 | * | 3/2013 | Kim et al. | 257/295 |
| 2013/0146958 | A1 | * | 6/2013 | Kim et al. | 257/302 |
| 2013/0153990 | A1 | * | 6/2013 | Lee et al. | 257/329 |

FOREIGN PATENT DOCUMENTS

| JP | 2007-528609 A | 10/2007 |
| KR | 10-2006-0114991 A | 11/2006 |
| KR | 10-2006-0126795 A | 12/2006 |
| KR | 10-2009-0110680 A | 10/2009 |

* cited by examiner

*Primary Examiner* — Matthew W Such
*Assistant Examiner* — Samuel Lair
(74) *Attorney, Agent, or Firm* — F. Chau & Associates, LLC

(57) ABSTRACT

Semiconductor devices having vertical channel transistors are provided. The semiconductor device includes an insulation layer on a substrate and a buried bit line on the insulation layer. The buried bit line extends in a first direction. An active pillar is disposed on the buried bit line. The active pillar includes a lower dopant region, a channel region having a first sidewall and an upper dopant region vertically stacked on the buried bit line. A contact gate electrode is disposed to be adjacent to the first sidewall of the channel region. A word line is electrically connected to the contact gate electrode. The word line extends in a second direction intersecting the first direction. A string body connector is electrically connected to the channel region. Related methods are also provided.

16 Claims, 29 Drawing Sheets

SEMICONDUCTOR DEVICES INCLUDING A VERTICAL CHANNEL TRANSISTOR AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0106857, filed on Oct. 19, 2011, the entirety of which is incorporated by reference herein.

TECHNICAL FIELD

Embodiments of the present disclosure herein relate to semiconductor devices and methods of fabricating the same and more particularly to semiconductor devices including a vertical channel transistor and methods of fabricating the same.

DISCUSSION OF RELATED ART

The line widths of the semiconductor devices have been gradually reduced to increase the integration density of the semiconductor devices. However, increasing the integration density of the semiconductor devices may be limited by a need to use high-cost exposure techniques to reduce line width. As an alternative to increase the integration density of the semiconductor devices, semiconductor devices having vertical channel transistors may be considered. In the event that the vertical channel transistors are applied to dynamic random access memory (DRAM) devices, the source and drain regions of the transistors may be vertically stacked.

SUMMARY

Exemplary embodiments of the inventive concept are directed to semiconductor devices including a vertical channel transistor and methods of fabricating the same.

According to an exemplary embodiment, a semiconductor device includes a first insulation layer on a substrate and a plurality of buried bit lines on the first insulation layer. The buried bit lines extend in a first direction. A plurality of active pillars are disposed on the buried bit lines. At least one of the active pillars includes respective lower dopant regions, respective channel regions respectively having first sidewalls, and respective upper dopant regions vertically stacked on a corresponding buried bit line of the buried bit lines. A plurality of contact gate electrodes are disposed to be adjacent to respective ones of the first sidewalls of the channel regions. A plurality of word lines are electrically connected to the contact gate electrodes. The word lines extend in a second direction intersecting the first direction. A plurality of string body connectors electrically connect the channel regions to each other.

Top surfaces of the string body connectors may be coplanar with bottom surfaces of the upper dopant regions, and bottom surfaces of the string body connector may be coplanar with top surfaces of the lower dopant regions.

The string body connectors may have the same conductivity type as the channel regions.

The lower dopant regions may be two dimensionally arrayed in a plan view and may be spaced apart from each other.

The lower dopant regions may contact top surfaces of the buried bit lines.

The first insulation layer may extend to cover sidewalls of the buried bit lines.

Each of the string body connectors may electrically connect the channel regions to each other. The channel regions are parallel with each other and are arrayed in a row in the second direction.

The semiconductor device may further include a voltage generator electrically connected to the string body connectors.

The semiconductor device may further include a second insulation layer between the first insulation layer and the substrate.

According to an exemplary embodiment, a semiconductor device includes an insulation layer on a substrate, a buried bit line on the insulation layer, the buried bit line extending in a first direction, and an active pillar on the buried bit line. The active pillar includes a lower dopant region, a channel region having a first sidewall, and an upper dopant region vertically stacked on the buried bit line. A contact gate electrode is disposed to be adjacent to the first sidewall of the channel region. A word line is electrically connected to the contact gate electrode. The word line extends in a second direction intersecting the first direction. A string body connector is electrically connected to the channel region.

According to an exemplary embodiment, a method of fabricating a semiconductor device includes forming, in a first substrate, string body connectors extending in a first direction, upper dopant regions disposed on top surfaces of the string body connectors and spaced apart from each other, and lower dopant regions on bottom surfaces of the string body connectors and spaced apart from each other, and forming buried bit lines on bottom surfaces of the lower dopant regions. The buried bit lines extend in a second direction crossing the first direction. A first insulation layer is formed to cover the buried bit lines and the first substrate. The first insulation layer is physically bonded to a second substrate. The first substrate is planarized to expose the upper dopant regions. The first substrate is patterned to expose sidewalls of the upper dopant regions, the string body connectors and the lower dopant regions. Contact gate electrodes are formed on respective ones of the sidewalls of the string body connectors.

The method may further include forming a second insulation layer on the second substrate, e.g., before the first insulation layer is physically bonded to the second substrate. The first insulation layer may be physically bonded to the second insulation layer on the second substrate.

The buried bit lines and the first insulation layer may be exposed after the first substrate is patterned to expose the opposing first and second sidewalls of the upper dopant regions, the string body connectors and the lower dopant regions.

The method may further include forming a gate insulation layer between the string body connectors and the contact gate electrodes and between the upper dopant regions and the contact gate electrodes, and forming word lines connected to the contact gate electrodes. The word lines may be spaced apart from the upper dopant regions and disposed on the first substrate opposite to the second substrate and may extend in the first direction.

BRIEF DESCRIPTION OF THE DRAWINGS

The embodiments of the disclosure will become more apparent in view of the attached drawings and accompanying detailed description.

DETAILED DESCRIPTION OF THE EMBODIMENTS

Figure 1:
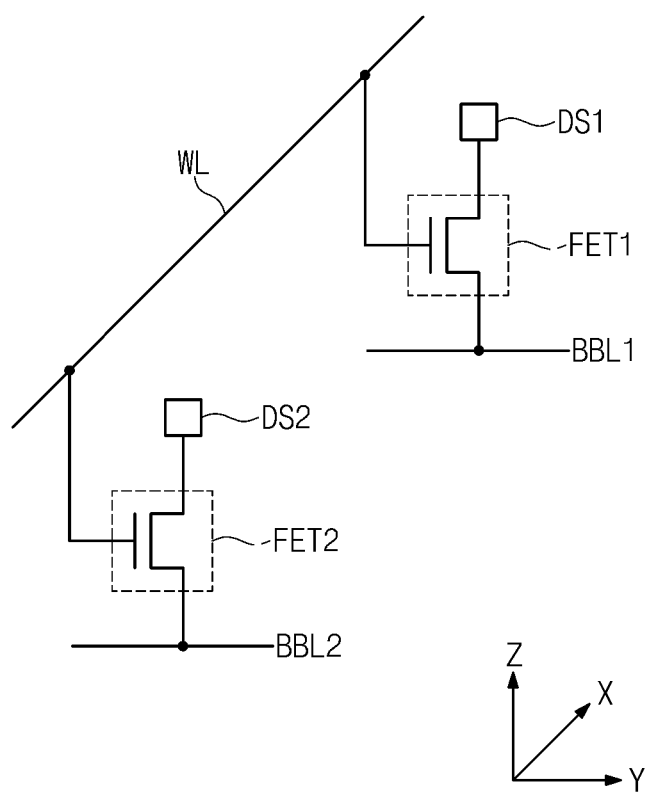
FIG. 1 is a schematic circuit diagram illustrating vertical channel transistors included in a semiconductor device according to an exemplary embodiment.

Exemplary embodiments are described below with reference to the accompanying drawings. Many different forms and embodiments are possible without deviating from the spirit and teachings of this disclosure and so the disclosure should not be construed as limited to the exemplary embodiments set forth herein.

It will be understood that when an element such as a layer, region or substrate is referred to as being "on" or "connected (or coupled) to" another element, it can be directly on or connected (or coupled) to the other element or intervening elements may be present. In the drawings, the sizes and relative sizes of layers and regions may be exaggerated for clarity.

The same reference numerals or the same reference designators may denote the same or substantially the same elements throughout the specification and the drawings.

FIG. 1 is a schematic circuit diagram illustrating vertical channel transistors included in a semiconductor device according to an exemplary embodiment.

Referring to FIG. 1, a semiconductor device according to an exemplary embodiment includes a plurality of transistors, for example, a first transistor FET1 and a second transistor FET2. The first transistor FET1 corresponds to a first vertical channel transistor, and the second transistor FET1 corresponds to a second vertical channel transistor. Gate electrodes of the first and second vertical channel transistors FET1 and FET2 are electrically connected to a word line WL.

A first source/drain terminal of the first vertical channel transistor FET1 is electrically connected to a first buried bit line BBL1, and a first source/drain terminal of the second vertical channel transistor FET2 is electrically connected to a second buried bit line BBL2. The first and second buried bit lines BBL1 and BBL2 are independently controlled. The word line WL crosses the buried bit lines BBL1 and BBL2.

According to an exemplary embodiment, a first data storage element DS1 is electrically connected to a second source/drain terminal of the first vertical channel transistor FET1, and a second data storage element DS2 is electrically connected to a second source/drain terminal of the second vertical channel transistor FET2. The first vertical channel transistor FET1 and the first data storage element DS1 constitute a unit memory cell. Similarly, the second vertical channel transistor FET2 and the second data storage element DS2 constitute a unit memory cell. Each of the first and second vertical channel transistors FET1 and FET2 is used as a switching device of the respective unit memory cells. The data storage elements DS1 and DS2 are realized in various forms. For example, according to an embodiment, each of the data storage elements DS1 and DS2 includes a capacitor, a magnetic tunnel junction (MTJ) pattern or a variable resistor. The semiconductor device according to an exemplary embodiment includes a volatile memory device (e.g., a dynamic random access memory device) or a non-volatile memory device (e.g., a magnetic memory device or a resistive memory device). However, the data storage elements DS1 and DS2 are not limited to the capacitor, the magnetic tunnel junction (MTJ) pattern or a variable resistor. According to an embodiment, the data storage elements DS1 and DS2 are realized in many different forms.

Figure 2A:
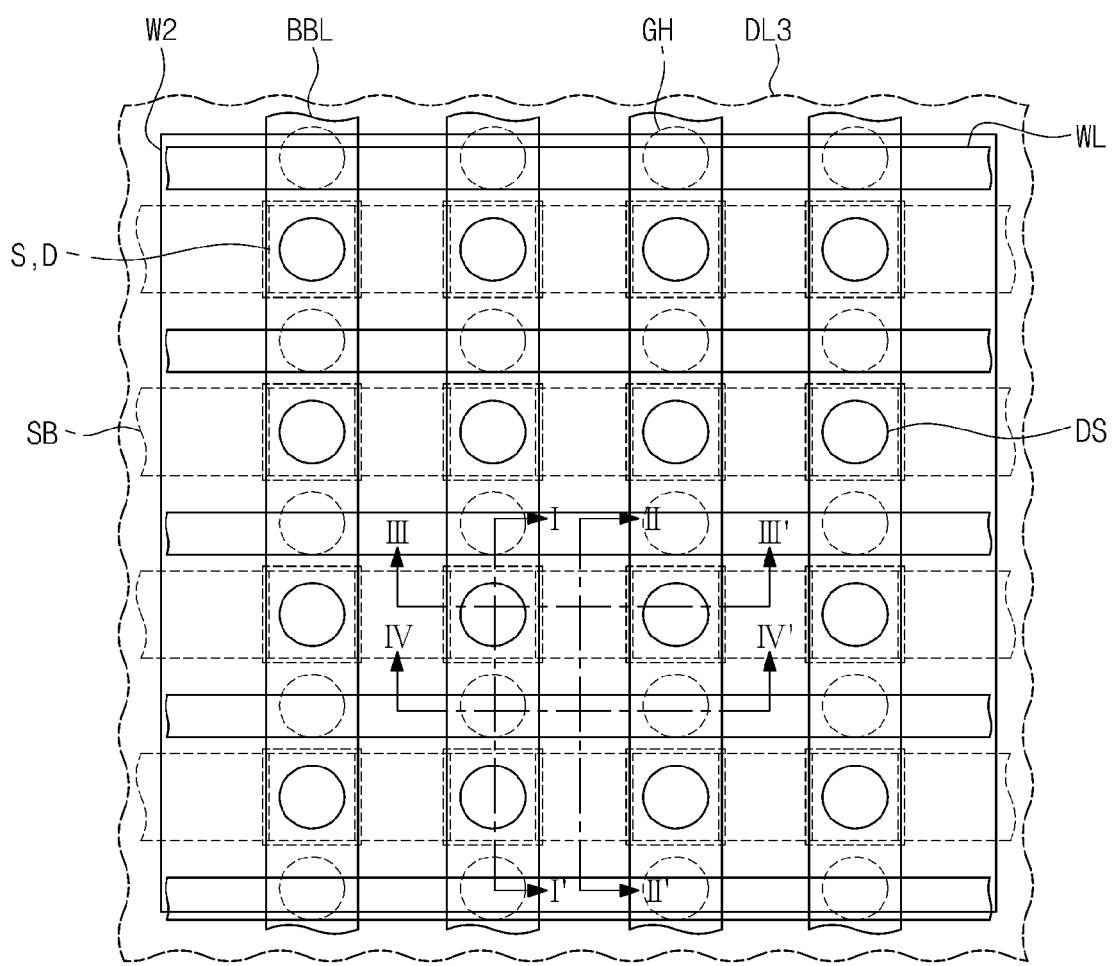
FIG. 2A is a layout diagram illustrating a semiconductor device according to an exemplary embodiment.
Figure 2B:
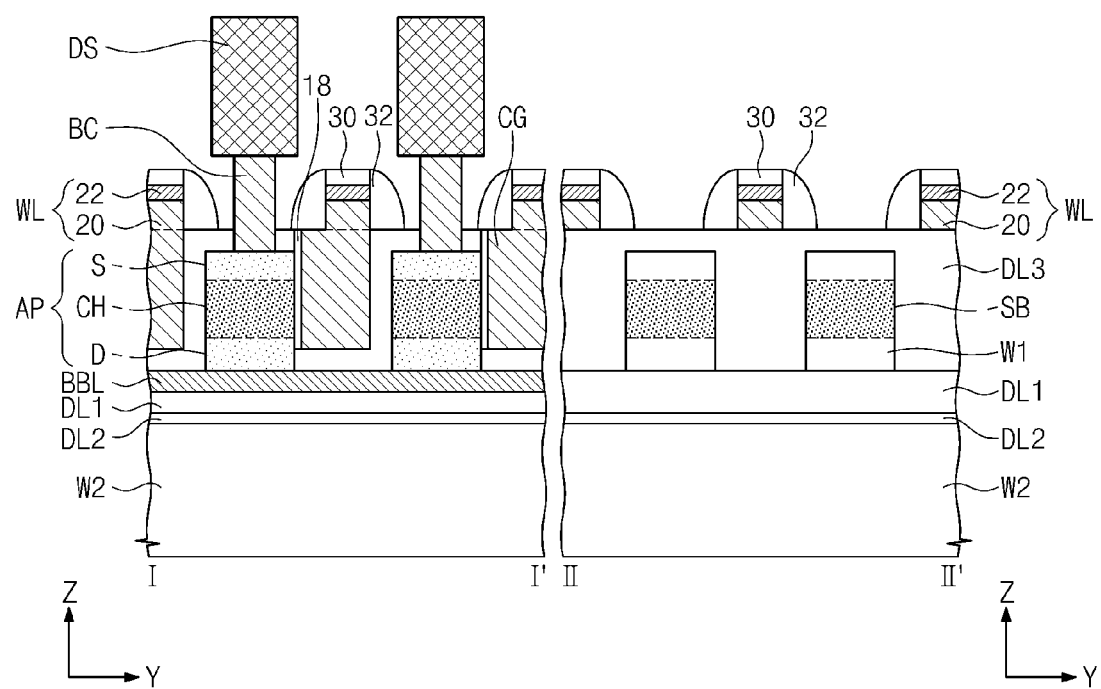
FIG. 2B is a merged cross sectional view taken along lines I-I' and II-II' of FIG. 2A.
Figure 2C:
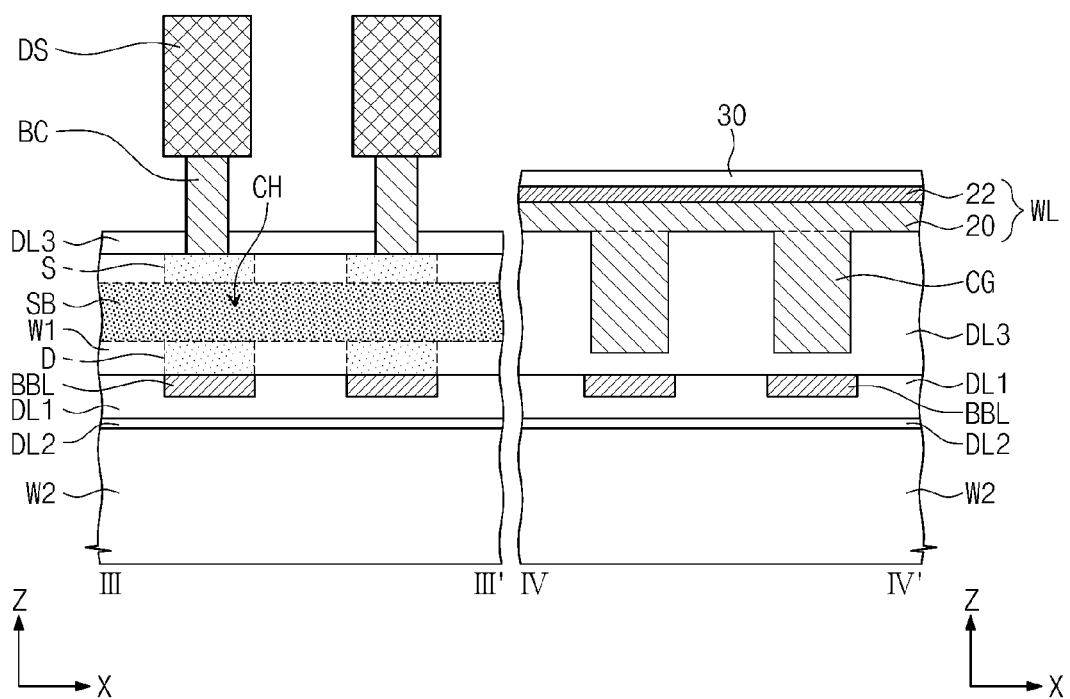
FIG. 2C is a merged cross sectional view taken along lines III-III' and IV-IV' of FIG. 2A.
Figure 2D:
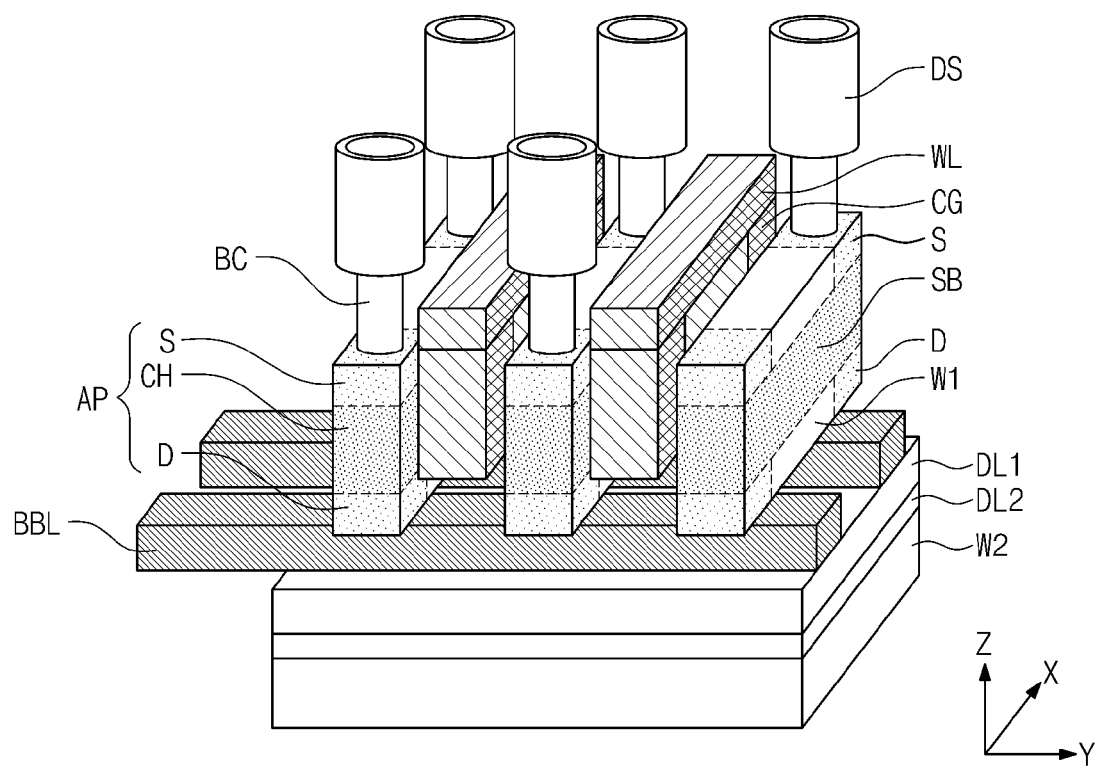
FIG. 2D is a perspective view illustrating a semiconductor device according to an exemplary embodiment.

FIG. 2A is a layout diagram illustrating a semiconductor device according to an exemplary embodiment. FIG. 2B is a merged cross sectional view taken along lines I-I' and II-II' of FIG. 2A, FIG. 2C is a merged cross sectional view taken along lines III-III' and IV-IV' of FIG. 2A, and FIG. 2D is a perspective view illustrating a semiconductor device according to an exemplary embodiment.

Referring to FIGS. 2A, 2B, 2C and 2D, in a semiconductor device according to an exemplary embodiment, a second insulation layer DL2 and a first insulation layer DL1 are sequentially stacked on a second substrate W2. According to an embodiment, the first and second insulation layers DL1 and DL2 include a silicon oxide layer. According to an embodiment, the second substrate W2 includes a single crystalline silicon wafer. A plurality of parallel buried bit lines BBL are disposed on the first insulation layer DL1, and the buried bit lines BBL extend in a second direction, for example, a Y-axis direction. Each of the buried bit lines BBL includes a polymer layer doped with impurities and/or a metal containing layer. The first insulation layer DL1 extends to cover sidewalls of the buried bit lines BBL. A top surface of the first insulation layer DL1 is coplanar with top surfaces of the buried bit lines BBL. Bottom surfaces and the sidewalls of the buried bit lines BBL are covered with the first insulation layer DL1. Accordingly, the first insulation layer DL1 may minimize or decrease leakage currents that flow from the buried bit lines BBL toward the second substrate W2 during operation of the semiconductor device.

A plurality of active pillars AP are disposed on the buried bit lines BBL. Each of the active pillars AP includes an upper dopant region S and a lower dopant region D spaced apart from each other, and a channel region CH disposed between the upper and lower dopant regions S and D. The buried bit lines BBL overlap the lower dopant regions D in a plan view and contact the lower dopant regions D. The upper and lower dopant regions S and D are doped with impurities of the same conductivity type. For example, the upper and lower dopant regions S and D are doped with N-type impurities. The channel region CH is doped with impurities of an opposite conductivity type to that of the upper dopant region S. For example, according to an embodiment, the channel region CH is doped with P-type impurities. The upper dopant regions S are separated from each other. The channel regions CH arrayed in one row parallel with a first direction (e.g., an X-axis direction) crossing the second direction are connected to each other by a string body connector SB. For example, the string body connector SB connects the channel regions CH arrayed in the first direction to each other. The string body connector SB is doped with impurities of the same conductivity type as the channel region CH. The string body connector SB is used as a path for discharging holes accumulated in the channel regions CH. For example, according to an embodiment, the holes accumulated in the channel regions CH are discharged into an external power supply through the string body connector SB. Thus, the string body connector SB may prevent the channel regions CH from being electrically floated. Hence, a leakage current due to an operation of a parasitic bipolar transistor (also referred to as a floating body effect) may be suppressed to improve a data retention characteristic of memory cells and to address a test screen problem. The string body connectors SB, the channel regions CH and the dopant regions S and D are disposed in a first substrate W1.

Word lines WL extending in the first direction (e.g., an X-axis direction) are disposed over the active pillars AP and opposite to the buried bit lines BBL. Each of the word lines WL includes a first word line 20 and a second word line 22 which are sequentially stacked. The first word line 20 includes, for example, a doped polysilicon pattern, and the second word line 22 includes, for example, a metal containing layer pattern. Capping patterns 30 are disposed on respective ones of the word lines WL. Sidewalls of the word lines WL are covered with spacers 32. A plurality of contact gate electrodes CG are disposed adjacent to first sidewalls of respective ones of the active pillars AP. The contact gate electrodes CG are arrayed in each row and electrically connected to corresponding ones of the word lines WL. Each of the contact gate electrodes CG has a contact plug shape. A gate insulation layer 18 is disposed between a corresponding one of the contact gate electrodes CG and a corresponding one of the active pillars AP. When viewed from a vertical cross sectional view taken along a line D-D' of FIG. 2A, the word line WL and the contact gate electrodes CG connected to the word line WL have a comb-shaped configuration. The first word line 20 and the contact gate electrodes CG connected to the first word line 20 include the same material layer.

A third insulation layer DL3 is disposed between second sidewalls of the active pillars AP opposite to the first sidewalls of the active pillars AP and the contact gate electrodes CG adjacent to the second sidewalls of the active pillars AP. A thickness of the third insulation layer DL3 (e.g., a distance between the second sidewalls of the active pillars AP and the contact gate electrodes CG adjacent to the active pillars AP) is greater than a horizontal thickness of the gate insulation layer 18. Thus, a voltage applied to the contact gate electrodes CG may have an influence on channel modulation near the first sidewalls of the active pillars AP. The third insulation layer DL3 extends to cover the first substrate W1.

Data storage elements DS are electrically connected to respective ones of the upper dopant regions S through data storage element contacts BC that penetrate the third insulation layer DL3. Each of the data storage elements DS includes a capacitor, a magnetic tunnel junction (MTJ) pattern or a variable resistor. When the data storage elements DS are capacitors, each of the data storage elements DS includes a lower electrode, a dielectric layer and an upper electrode.

Figure 3A:
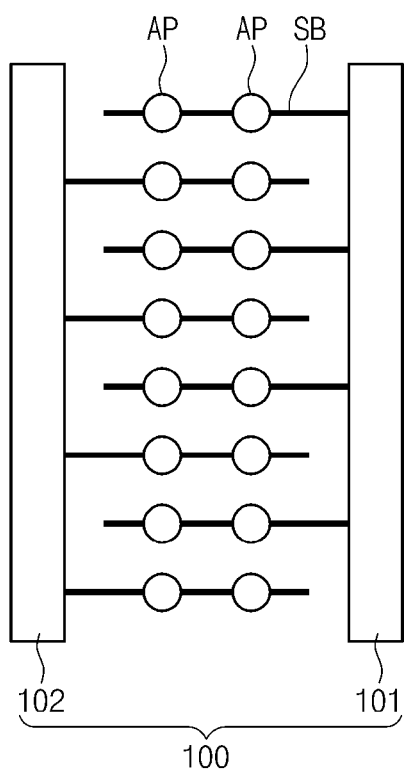
FIGS. 3A, 3B and 3C are schematic views illustrating connections between string body connectors and a voltage generator of semiconductor devices according to some exemplary embodiments.
Figure 3B:
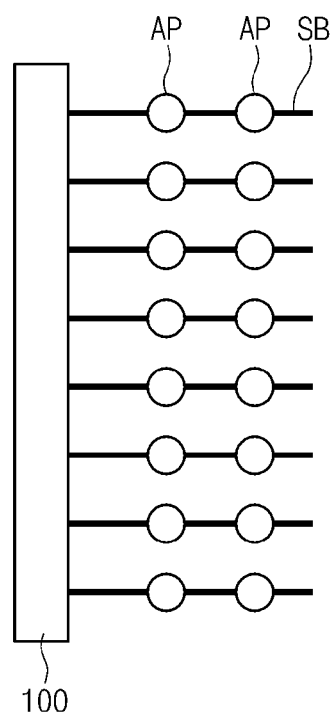
Figure 3C:
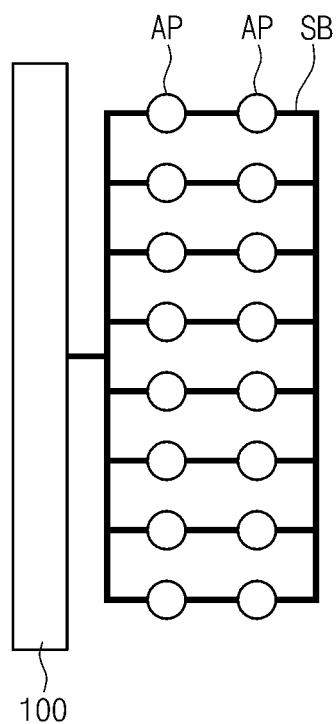

FIGS. 3A to 3C are schematic views illustrating connections between string body connectors and a voltage generator of semiconductor devices according to some exemplary embodiments.

Referring to FIGS. 3A, 3B and 3C, a semiconductor device according to an exemplary embodiment includes one or more voltage generators 100 which are electrically connected to the string body connectors SB illustrated in FIGS. 2A, 2B and 2C. The string body connectors SB have line shapes and are parallel with each other. The voltage generator 100 generates a voltage that is applied to the string body connectors SB.

In an exemplary embodiment, two voltage generators 100 are provided that include a first voltage generator 101 and a second voltage generator 102 as illustrated in FIG. 3A. The first voltage generator 101 is electrically connected to odd-numbered string body connectors of the string body connectors SB, and the second voltage generator 102 is electrically connected to even-numbered string body connectors of the string body connectors SB. The first and second voltage generators 101 and 102 generate the same voltage. For example, a voltage applied to the odd-numbered string body connectors SB is equal or substantially equal to a voltage applied to the even-numbered string body connectors SB.

In an exemplary embodiment, first ends of all of the string body connectors SB are electrically connected to a single voltage generator 100 as illustrated in FIG. 3B.

In an exemplary embodiment, first ends of the string body connectors SB are electrically connected to a single voltage generator 100, and second ends of the string body connectors SB opposite to the first ends are electrically connected to each other as illustrated in FIG. 3C.

A process for forming a semiconductor device is now described. FIGS. 4A, 5A, 6A, 7A, 8A, 9A, 10A, 11A, and 12A are plan views illustrating process steps for forming the semiconductor device of FIG. 2A, and FIGS. 4B, 5B, 6B, 7B, 8B, 9B, 10B, 11B, 12B, 4C, 5C, 6C, 7C, 8C, 9C, 10C, 11C, 12C, 9D, and 9E are cross sectional views illustrating process steps for forming the semiconductor device of FIG. 2B. FIGS. 4B, 5B, 6B, 7B, 8B, 9B, 10B, 11B, and 12B are merged cross sectional views taken along lines I-I' and II-II' of FIGS. 4A, 5A, 6A, 7A, 8A, 9A, 10A, 11A, and 12A, and the FIGS. 4C, 5C, 6C, 7C, 8C, 9C, 10C, 11C, and 12C are merged cross sectional views taken along lines III-III' and IV-IV' of FIGS. 4A, 5A, 6A, 7A, 8A, 9A, 10A, 11A, and 12A, respectively. FIG. 9D is a merged cross sectional view taken along lines I-I' and II-II' of FIG. 9A, and FIG. 9E is a merged cross sectional view taken along lines III-III' and IV-IV' of FIG. 9A.

Figure 4A:
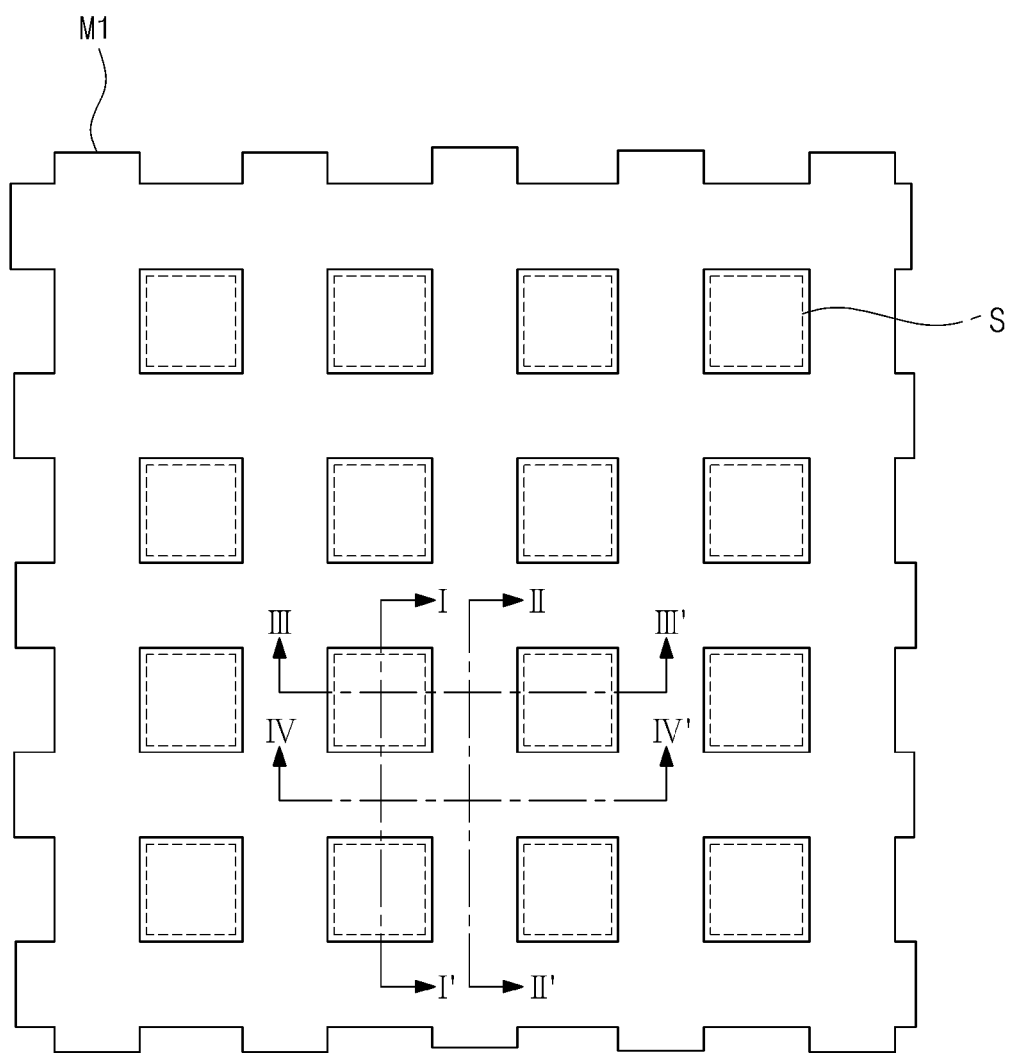
FIGS. 4A, 5A, 6A, 7A, 8A, 9A, 10A, 11A, and 12A are plan views illustrating process steps for forming the semiconductor device of FIG. 2A.
Figure 4B:
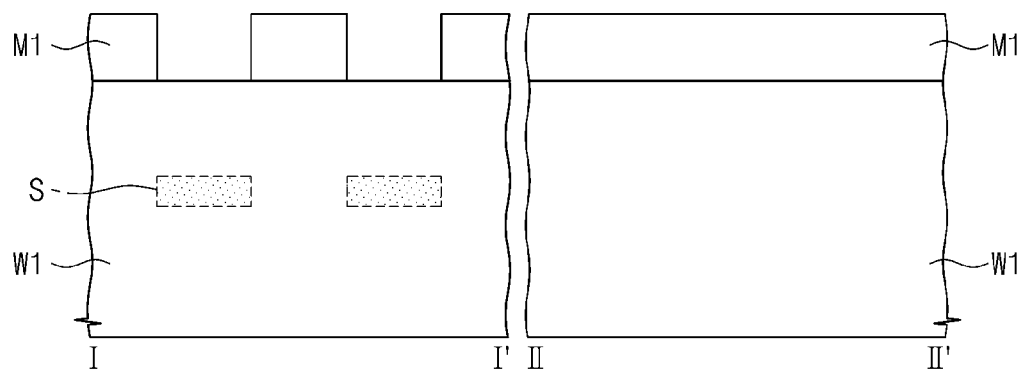
FIGS. 4B, 5B, 6B, 7B, 8B, 9B, 10B, 11B, 12B, 4C, 5C, 6C, 7C, 8C, 9C, 10C, 11C, 12C, 9D, and 9E are cross sectional views illustrating process steps for forming the semiconductor device of FIG. 2B.
Figure 4C:
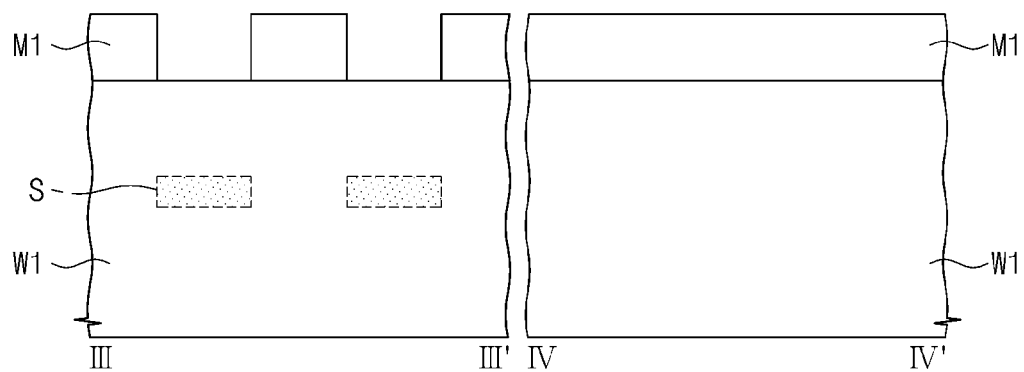

Referring to FIGS. 4A, 4B and 4C, a first mask pattern M1 is formed on a first substrate W1. The first substrate W1 includes, for example, a single crystalline silicon wafer. The first mask pattern M1 is formed to have a mesh shape. The first mask pattern M1 includes at least one of a silicon nitride layer, a silicon oxynitride layer, a silicon oxide layer and a photoresist layer. An ion implantation process is performed using the first mask pattern M1 as an ion implantation mask, thereby forming upper dopant regions S at a predetermined depth in the first substrate W1. The upper dopant regions S are formed to have island shapes which are spaced apart from each other in a plan view. The upper dopant regions S are doped with N-type impurities.

Figure 5A:
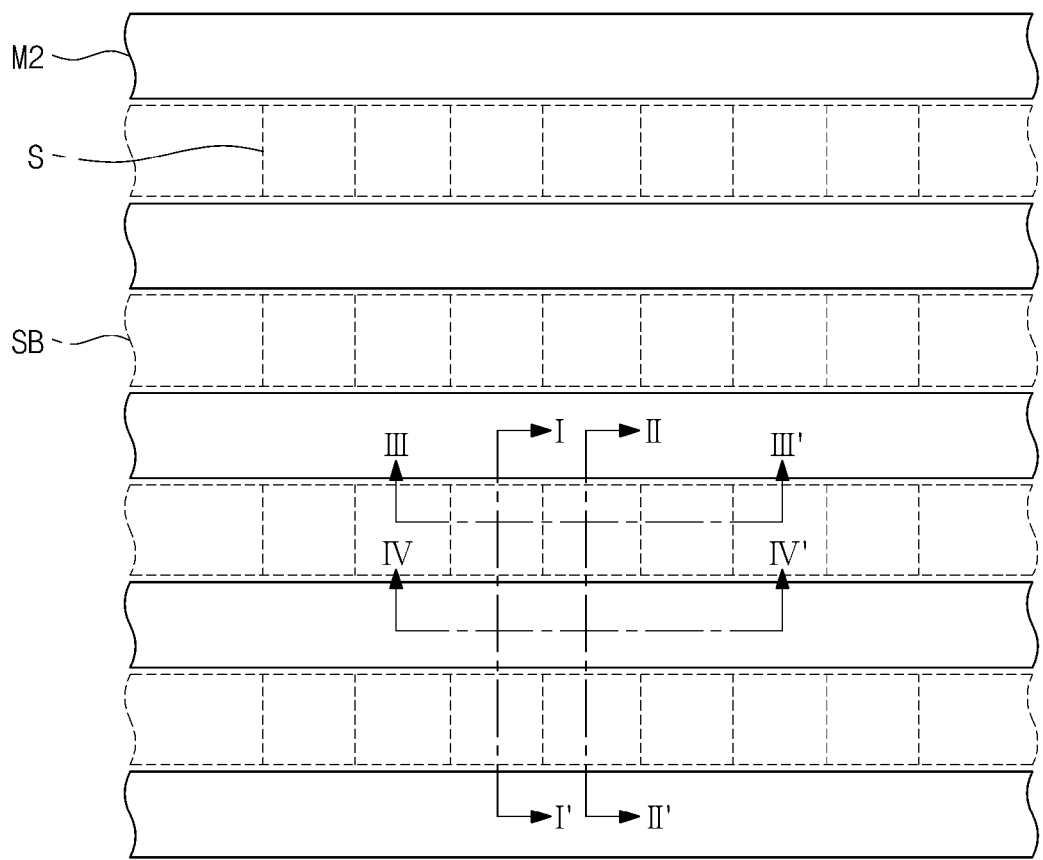
Figure 5B:
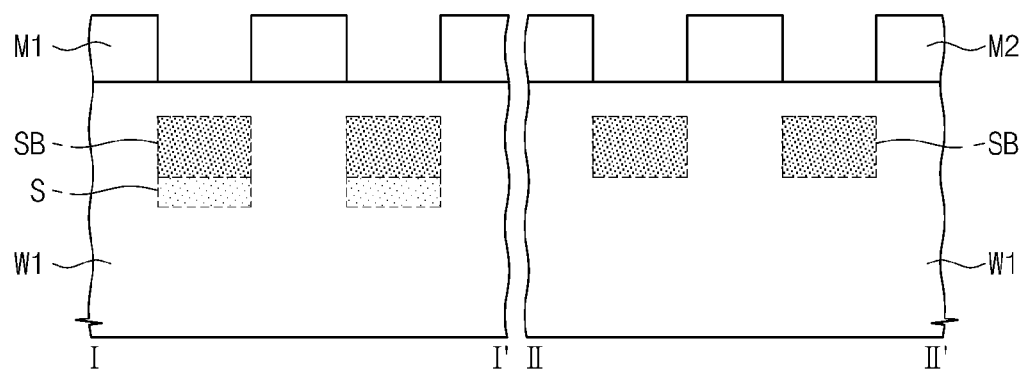
Figure 5C:
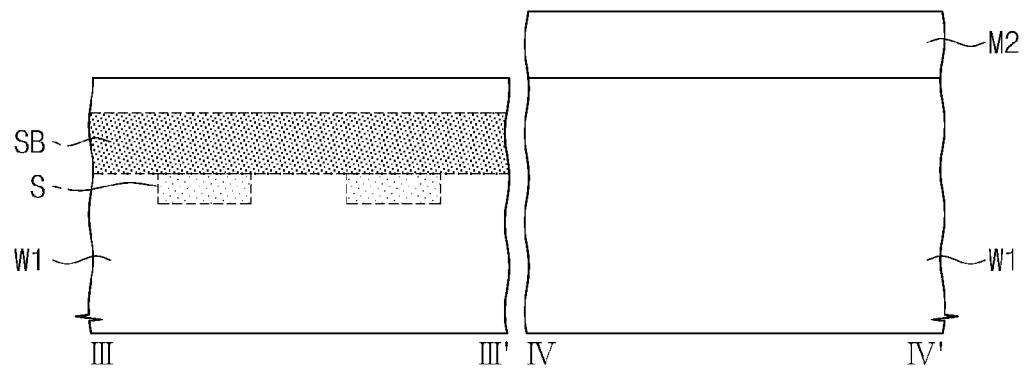

Referring to FIGS. 5A, 5B and 5C, the first mask pattern M1 is removed, and a second mask pattern M2 is formed on the first substrate W1. The second mask pattern M2 is formed to include a plurality of parallel line-shaped patterns extending in a first direction. An ion implantation process is performed using the second mask pattern M2 as an ion implantation mask, thereby forming string body connectors SB at a predetermined depth in the first substrate W1. The string body connectors SB are doped with P-type impurities. The string body connectors SB are formed on the upper dopant regions S. The string body connectors SB are formed to include a plurality of parallel line-shaped patterns extending in the first direction.

Figure 6A:
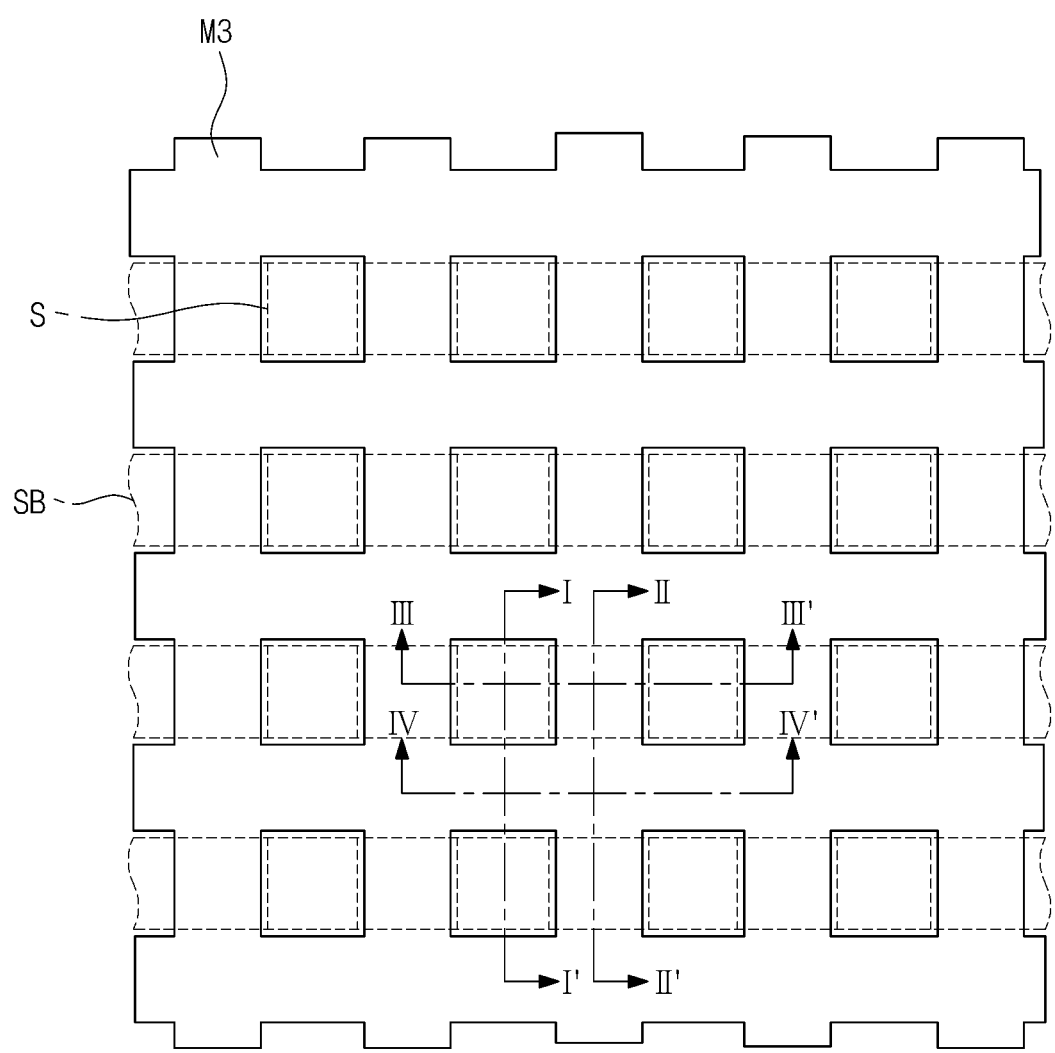
Figure 6B:
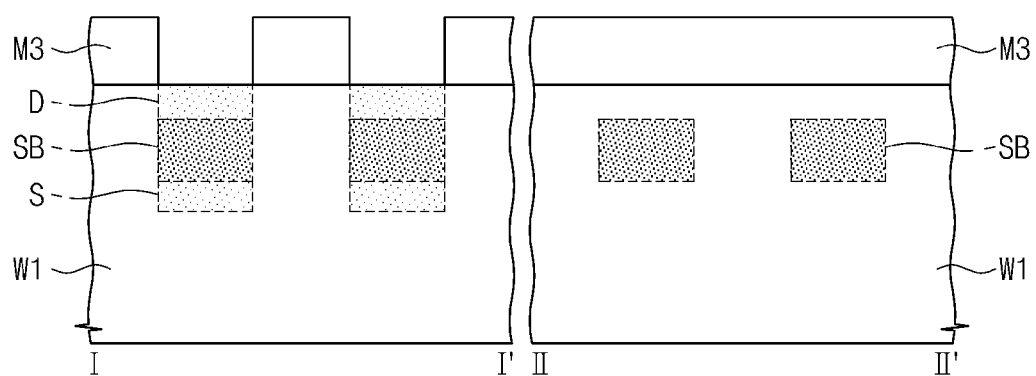
Figure 6C:
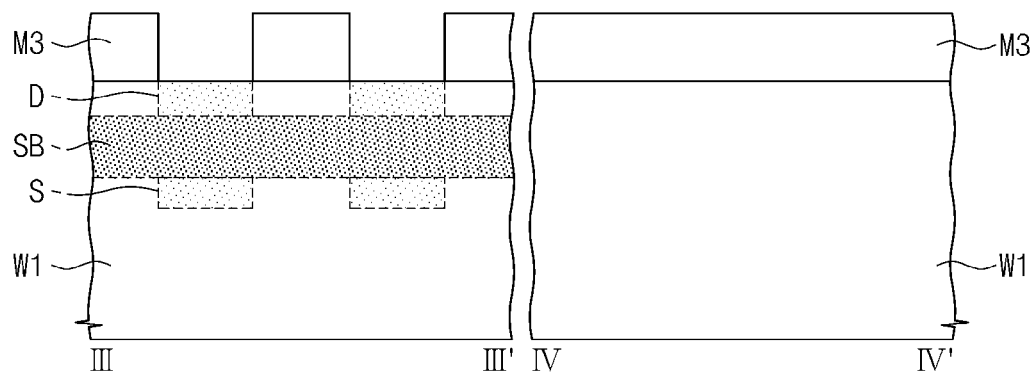

Referring to FIGS. 6A, 6B and 6C, the second mask pattern M2 is removed, and a third mask pattern M3 is formed on the first substrate W1. The third mask pattern M3 is formed to have the same shape as the first mask pattern M1. An ion implantation process is performed using the third mask pattern M3 as an ion implantation mask, thereby forming lower dopant regions D at a predetermined depth in the first substrate W1. The lower dopant regions D are formed on the string body connectors SB and opposite to the upper dopant regions S. The lower dopant regions D are formed to have island shapes which are spaced apart from each other in a plan view. The lower dopant regions D are doped with N-type impurities. The lower dopant regions D are formed under a surface of the first substrate W1. For example, a surface of the lower dopant regions D opposite to the upper dopant regions S is coplanar with the surface of the first substrate W1.

The upper dopant regions S and the lower dopant regions D are formed using two different mask patterns (e.g., the first and third mask patterns M1 and M3). However, in an exemplary embodiment, the upper dopant regions S and the lower dopant regions D are formed using a single mask pattern, for example, the first mask pattern M1 in the process step illustrated in FIGS. 4A and 4B. For example, according to an embodiment, the upper dopant regions S and the lower dopant regions D are formed using two different ion implantation processes that employ the first mask pattern M1 as an ion implantation mask. For example, according to an embodiment, when the upper dopant regions S are formed using a first ion implantation process with first ion implantation energy, the lower dopant regions D are formed using a second ion implantation process with second ion implantation energy less than the first ion implantation energy.

Figure 7A:
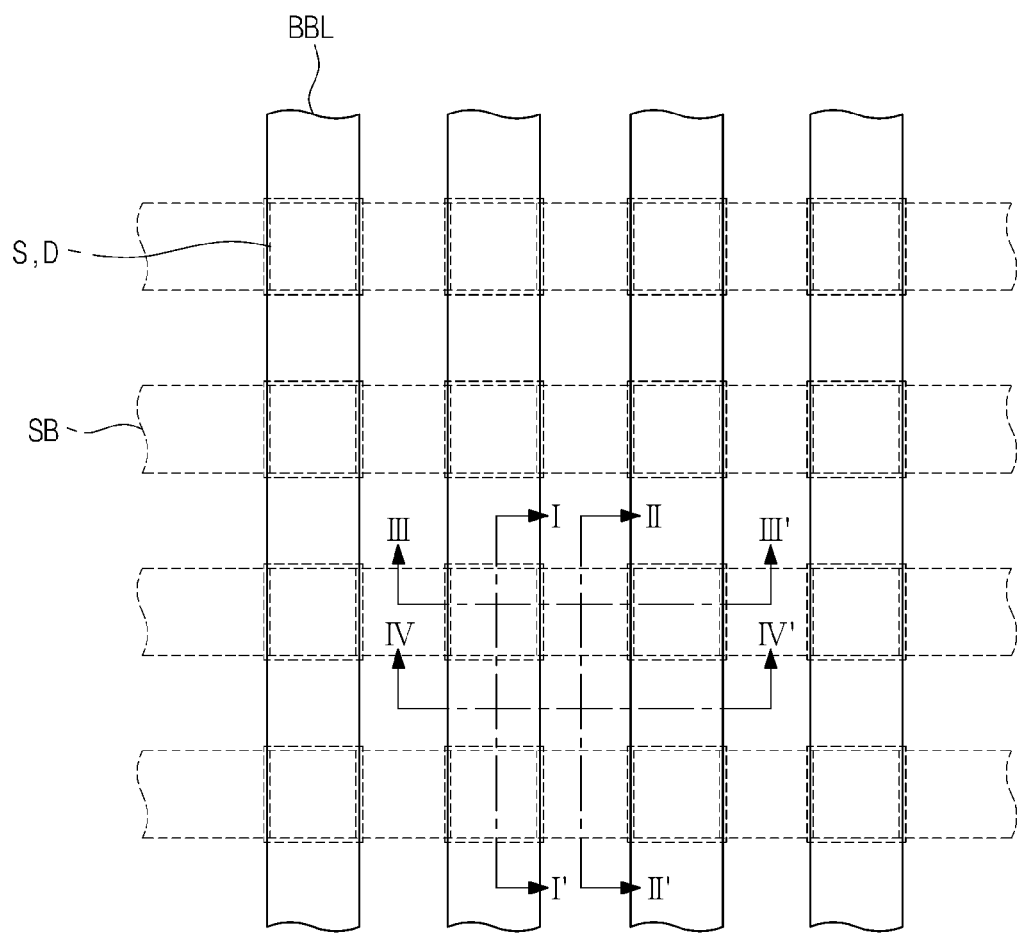
Figure 7B:
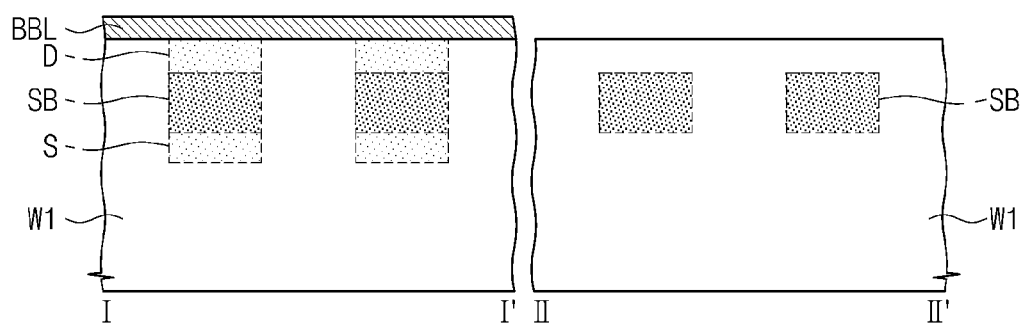
Figure 7C:
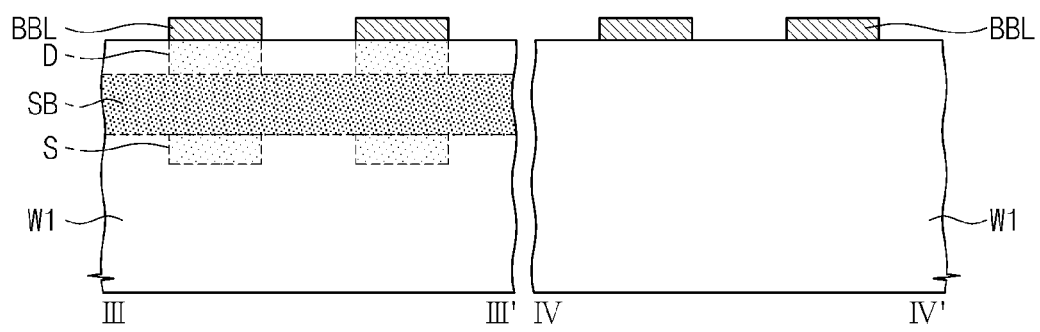

Referring to FIGS. 7A, 7B and 7C, the third mask pattern M3 is removed, and a plurality of parallel buried bit lines BBL are formed on the first substrate W1. The buried bit lines BBL are formed to extend in a second direction intersecting the first direction. The buried bit lines BBL are formed by depositing a conductive layer, such as a doped polysilicon layer or a metal containing layer, on the first substrate W1 and by patterning the conductive layer.

Figure 8A:
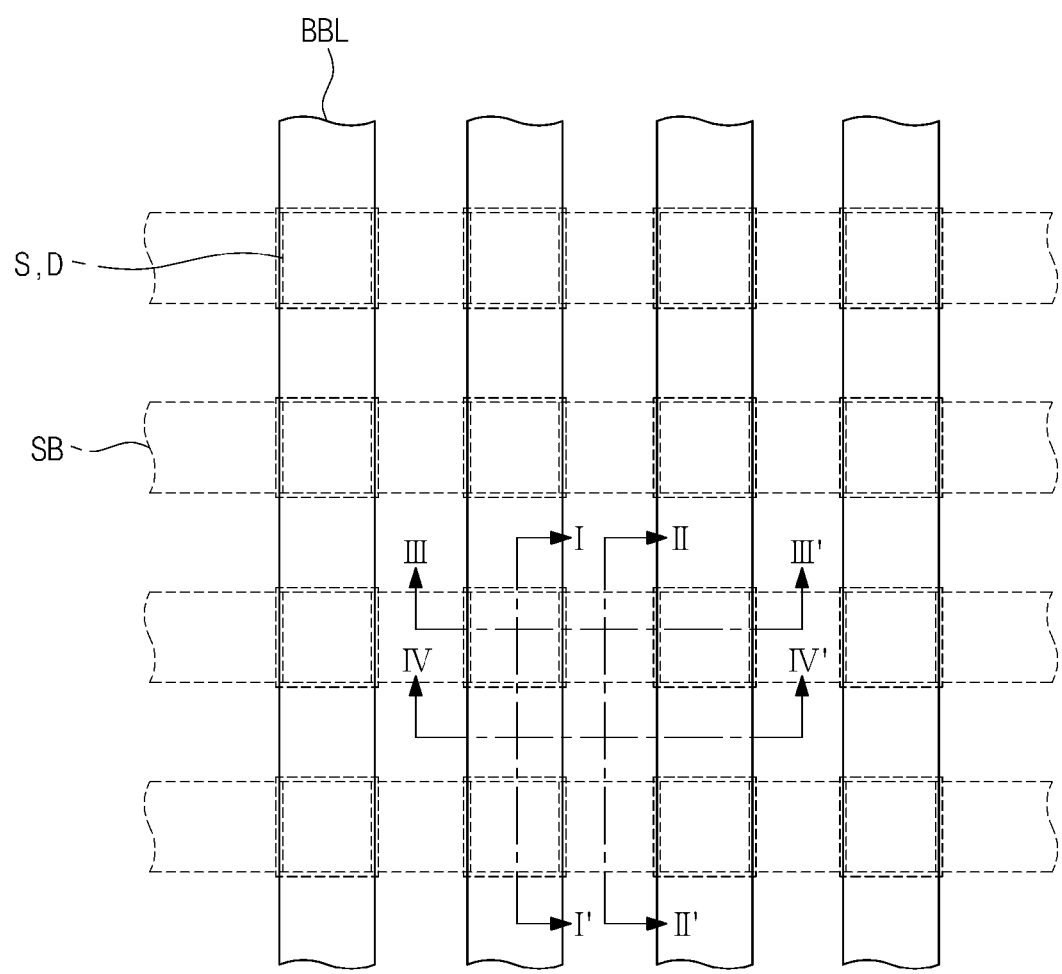
Figure 8B:
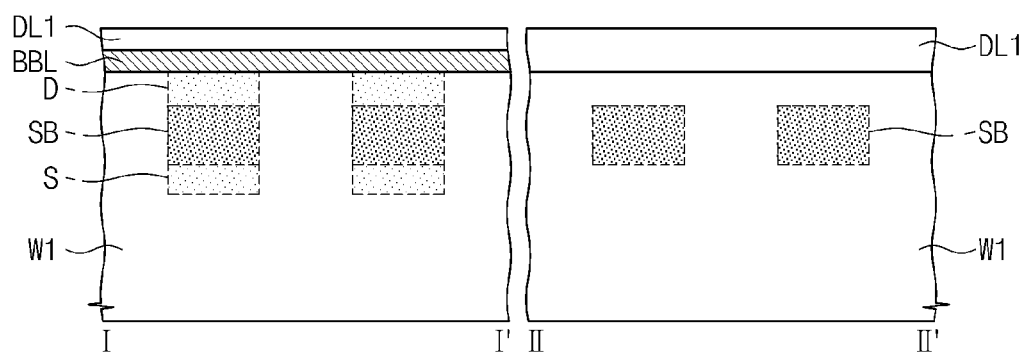
Figure 8C:
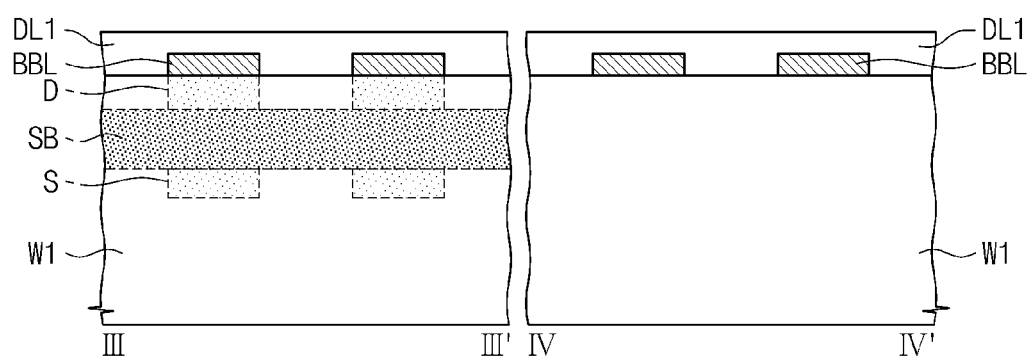
Figure 9A:
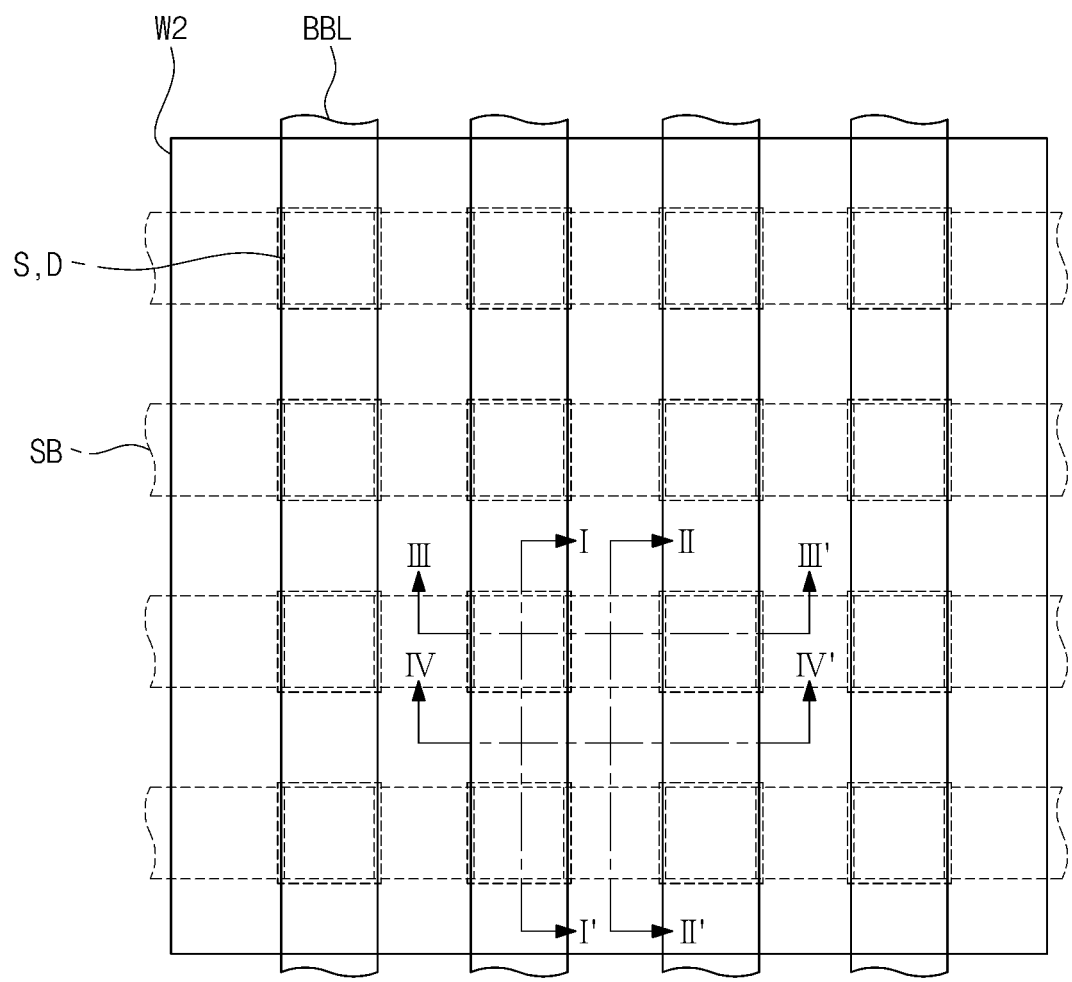

Referring to FIGS. 8A, 8B and 8C, a first insulation layer DL1 is formed to cover the first substrate W1 and the buried bit lines BBL. According to an embodiment, the first insulation layer DL1 includes a silicon oxide layer. A planarization process is performed on the first insulation layer DL1.

Figure 9B:
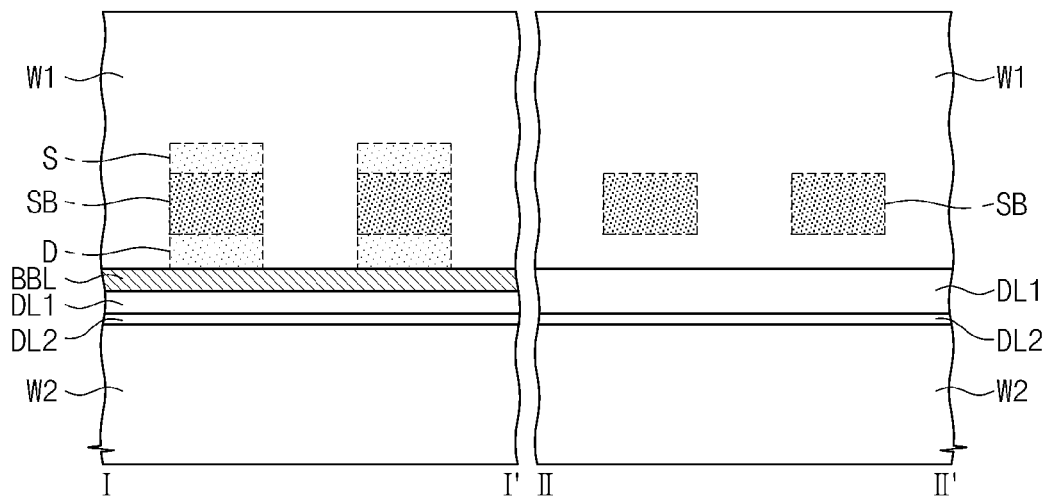
Figure 9C:
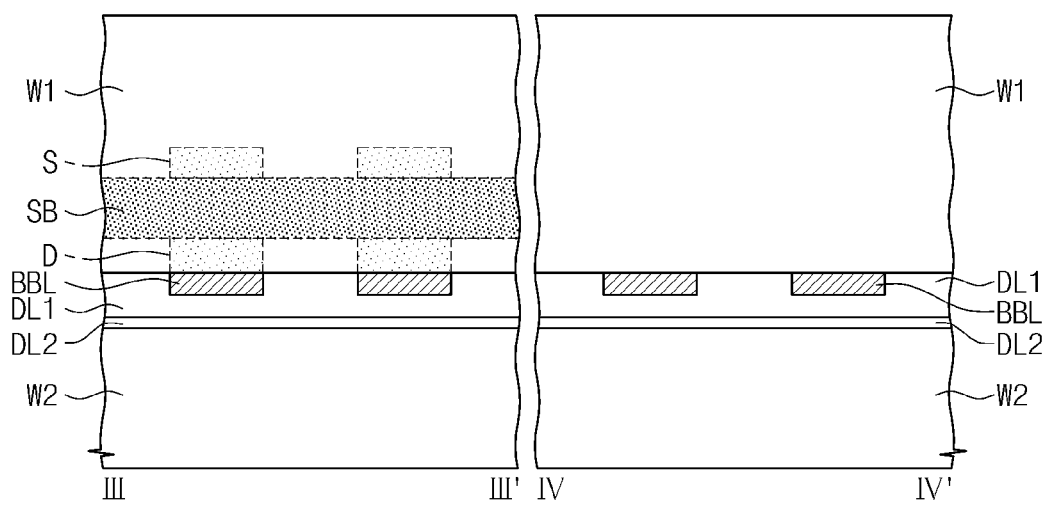
Figure 9D:
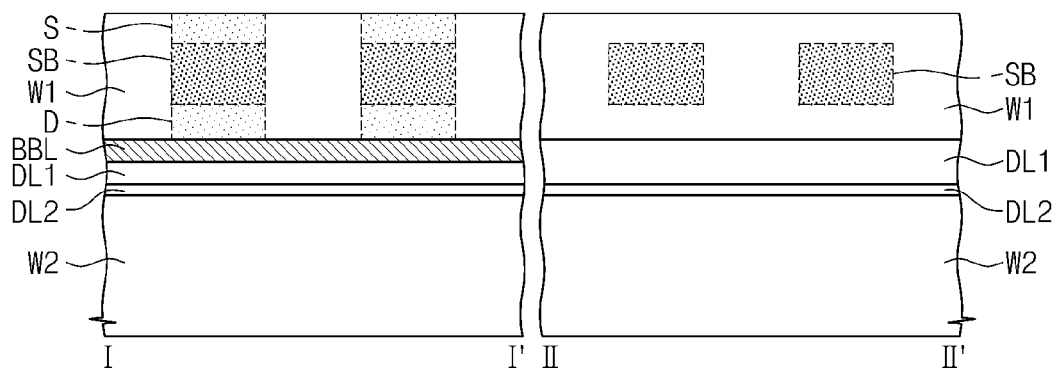
Figure 9E:
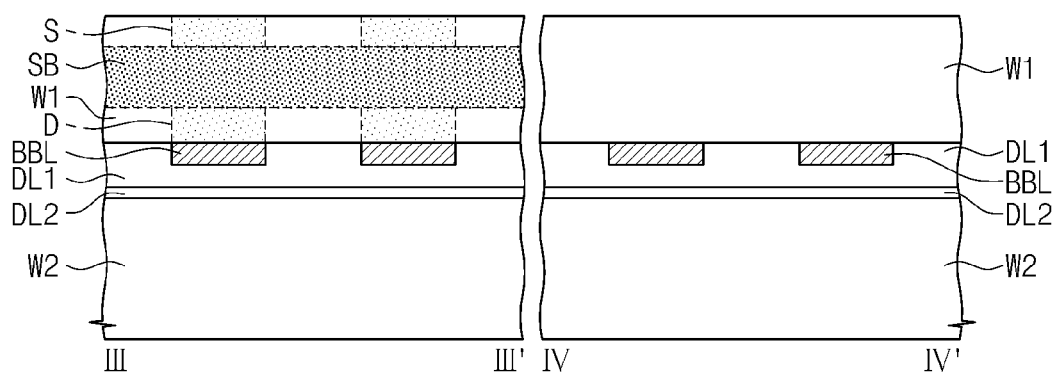

Referring to FIGS. 9A, 9B and 9C, the first substrate W1 is flipped such that a bottom surface of the first substrate W1 looks upward. A second substrate W2 is provided. According to an embodiment, the second substrate W2 includes a single crystalline silicon wafer. A second insulation layer DL2 is formed on the second substrate W2. According to an embodiment, the second insulation layer DL2 includes a silicon oxide layer. The first and second insulation layers DL1 and DL2 contact each other, and the first and second insulation layers DL1 and DL2 are physically bonded to each other by a thermal treatment process.

Referring to FIGS. 9D and 9E, the first substrate W1 is planarized to expose top surfaces of the upper dopant regions S.

Figure 10A:
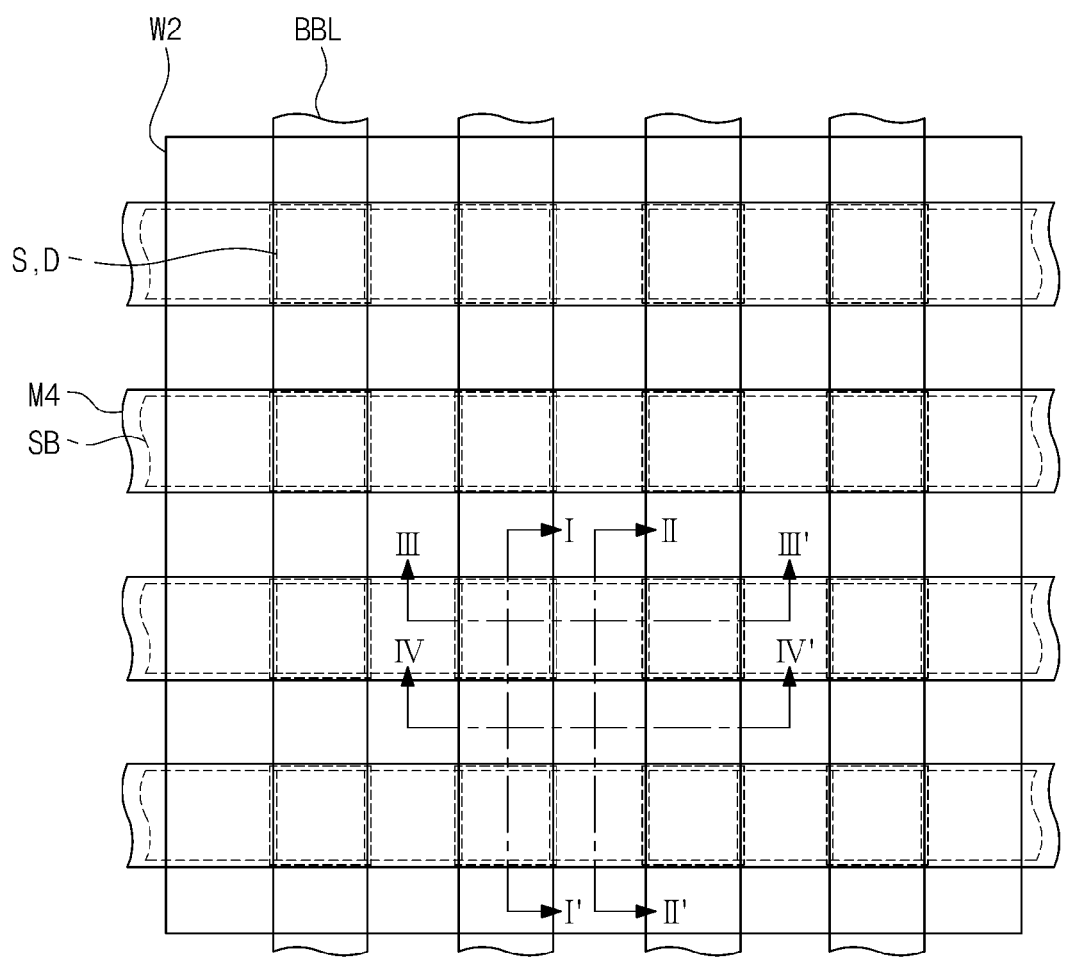
Figure 10B:
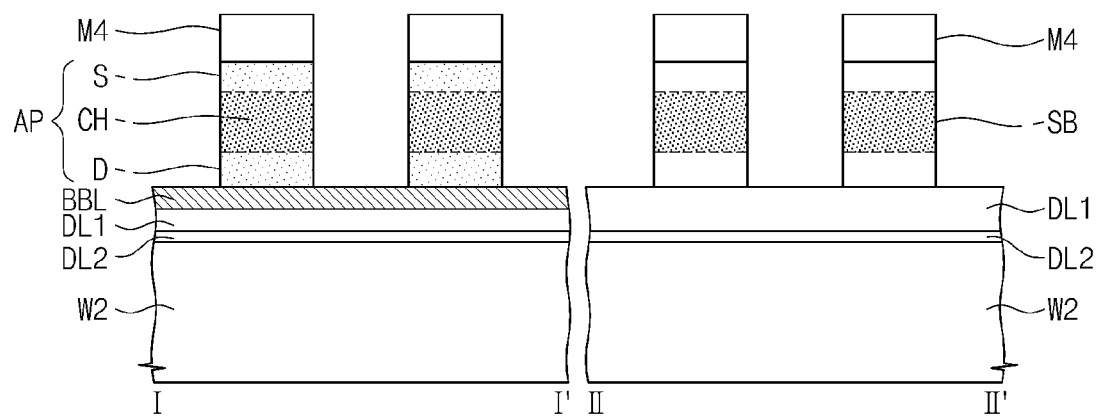
Figure 10C:
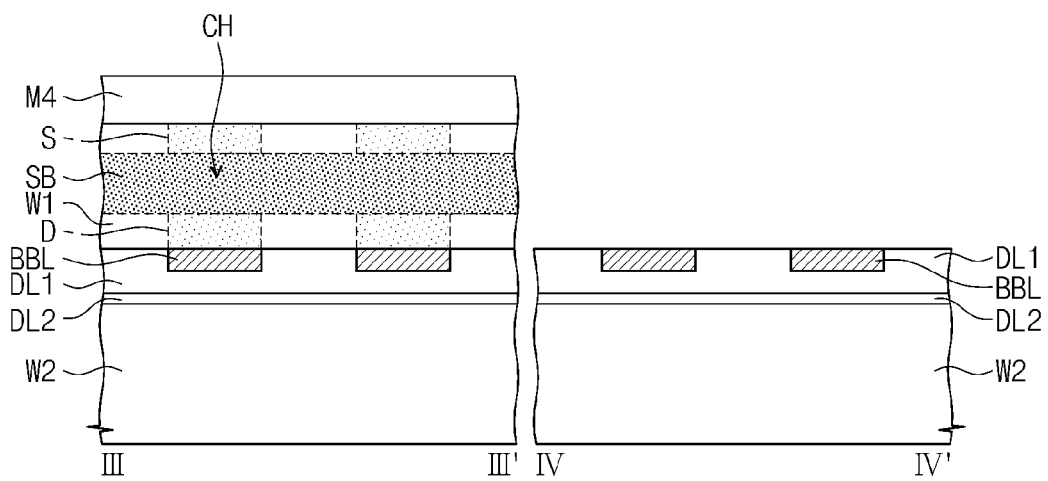

Referring to FIGS. 10A, 10B and 10C, a fourth mask pattern M4 is formed on the first substrate W1. The fourth mask pattern M4 is formed to include a plurality of parallel line shaped patterns extending in the first direction. The line shaped patterns of the fourth mask pattern M4 overlap respective ones of the string body connectors SB in a plan view. The first substrate W1 is etched using the fourth mask pattern M4 as an etch mask, thereby removing the first substrate W1 between the string body connectors SB. After the first substrate W1 is etched, portions of the first insulation layer DL1 and portions of each of the buried bit lines BBL are exposed. Further, after the first substrate W1 is etched, two opposite sidewalls of the upper dopant regions S, the string body connectors SB and the lower dopant regions D are exposed. The string body connectors SB between the upper dopant regions S and the lower dopant regions D function as channel regions CH during operation of the semiconductor device. The lower dopant region D, the channel region CH and the upper dopant region S, which are sequentially stacked, constitute an active pillar AP.

Figure 11A:
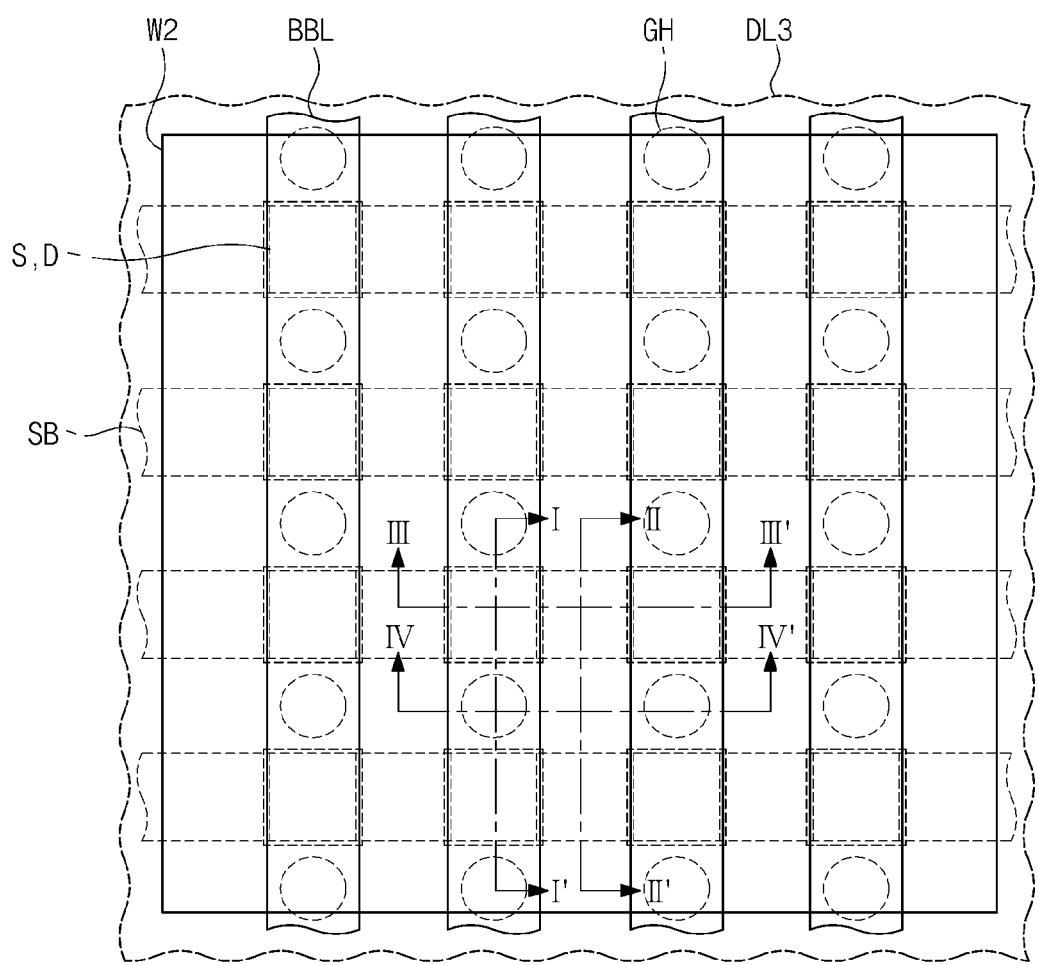
Figure 11B:
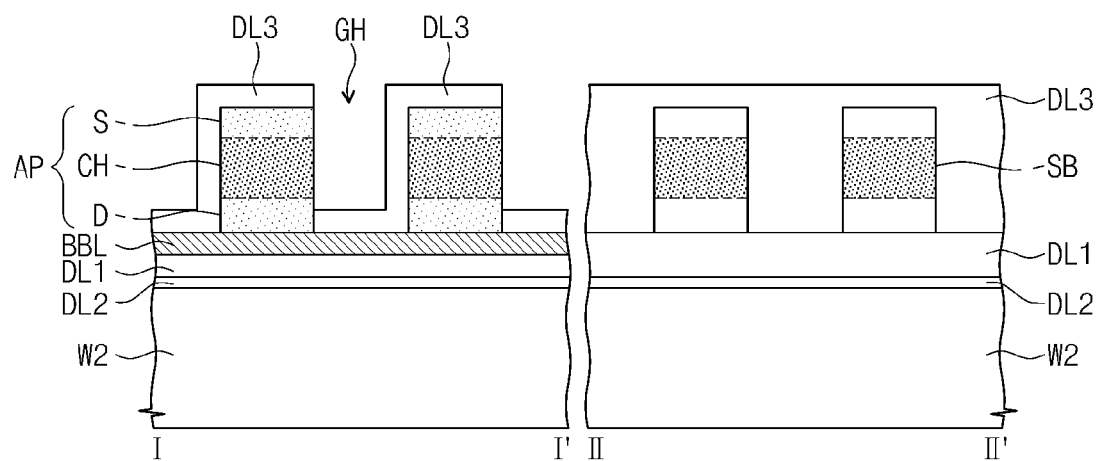
Figure 11C:
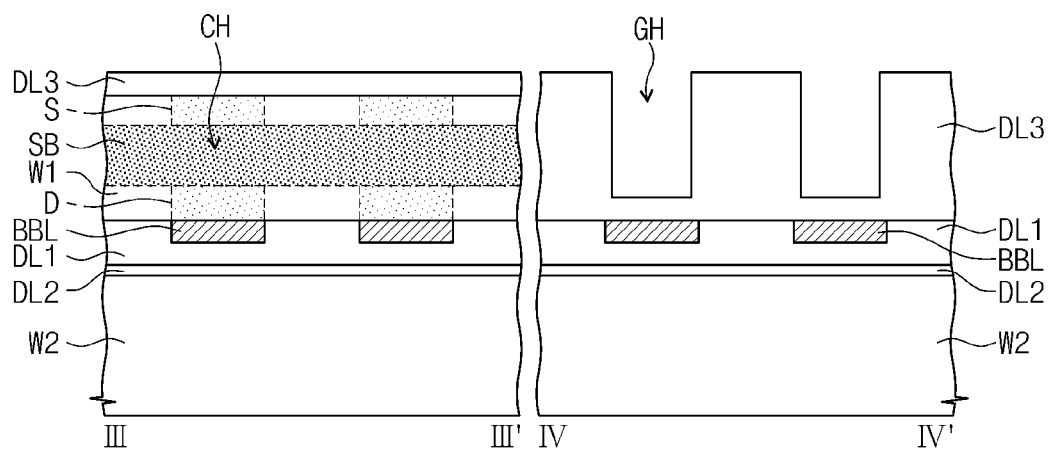

Referring to FIGS. 11A, 11B and 11C, the fourth mask pattern M4 is removed, and a third insulation layer DL3 is formed to cover the active pillars AP and the first insulation layer DL1. For example, the third insulation layer DL3 is formed to cover the two opposite sidewalls of the upper dopant regions S, the string body connectors SB and the lower dopant regions D. The third insulation layer DL3 is etched to form contact gate holes GH that expose first sidewalls of the upper dopant regions S, the channel regions CH and the lower dopant regions D. The contact gate holes GH are formed to have island shapes which are spaced apart from each other in a plan view. Bottom surfaces of the contact gate holes GH are spaced apart from the buried bit lines BBL. As such, even after the contact gate holes GH are formed, the buried bit lines BBL are still covered with the third insulation layer DL3. Thus, the buried bit lines BBL are not exposed after formation of the contact gate holes GH.

Figure 12A:
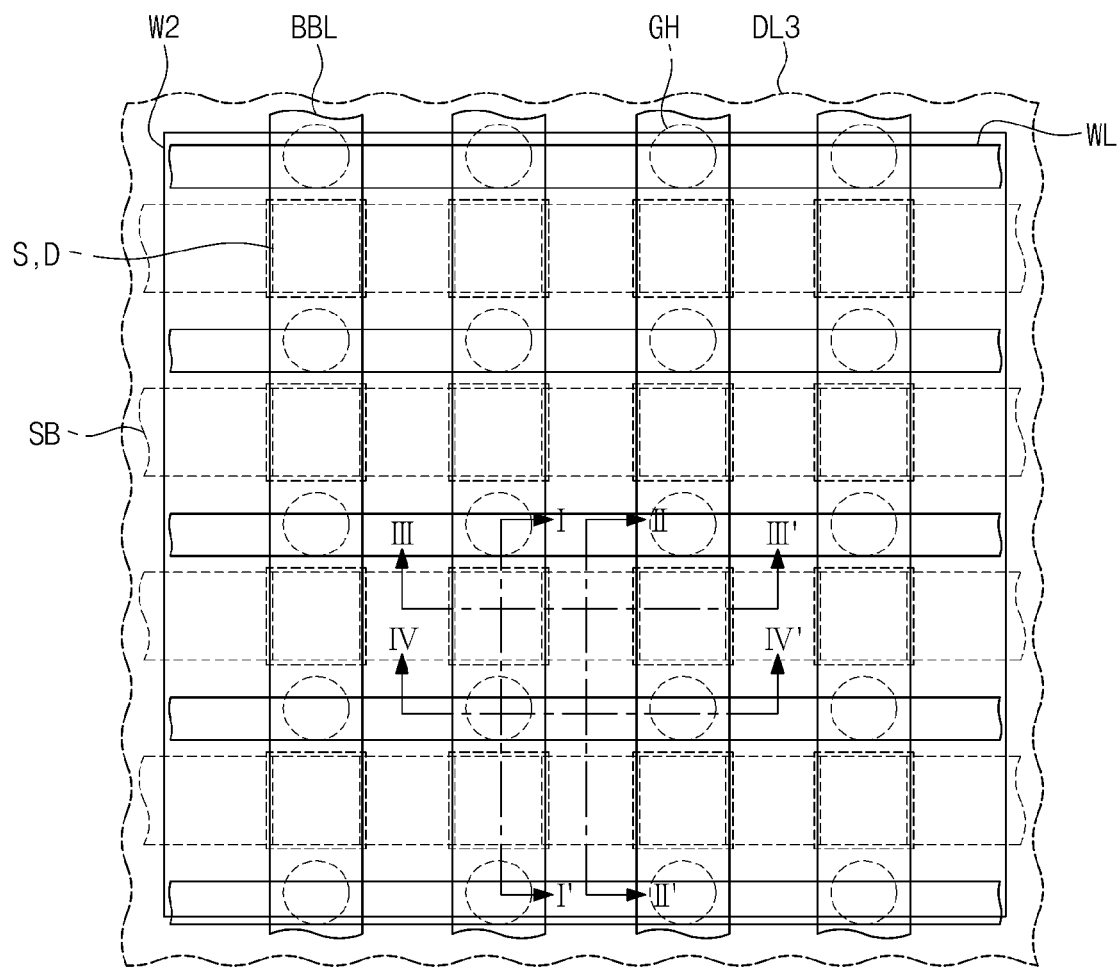
Figure 12B:
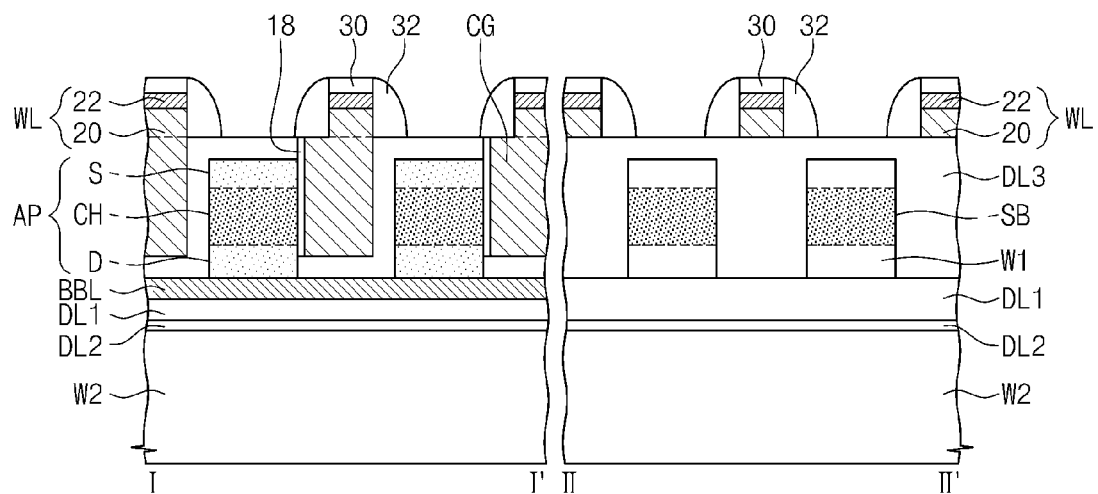
Figure 12C:
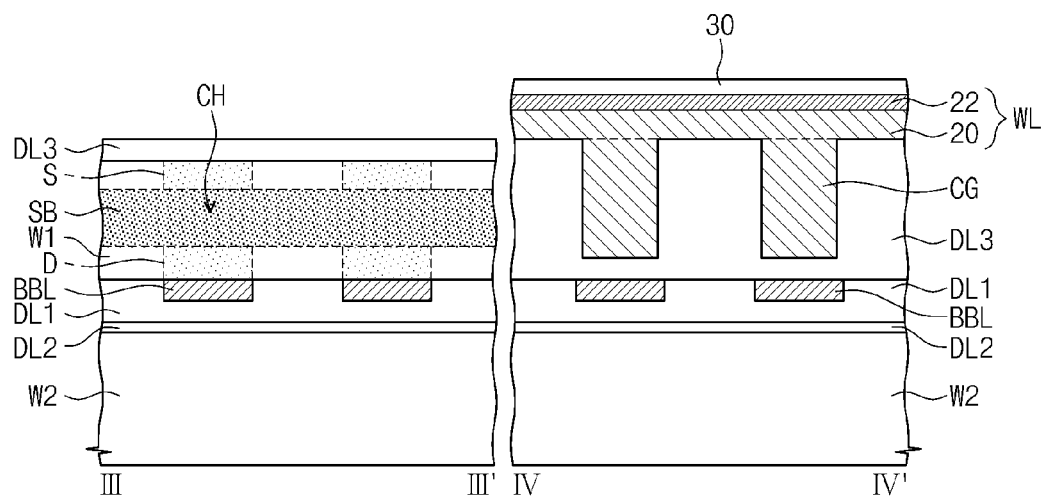

Referring to FIGS. 12A, 12B and 12C, a gate insulation layer 18 is formed on the exposed first sidewalls of the upper dopant regions S, the channel regions CH and the lower dopant regions D. A first word line layer 20, a second word line layer 22 and a capping layer 30 are sequentially formed in the contact gate holes GH and on the third insulation layer DL3, and the first word line layer 20, the second word line layer 22 and the capping layer are patterned to form contact gate electrodes CG filling the contact gate holes GH and word lines WL on the third insulation layer DL3. Spacers 32 are then formed on sidewalls of the word lines WL.

Referring again to FIGS. 2A, 2B, 2C and 2D, according to an embodiment, an interlayer insulation layer (not shown) is formed to cover the word lines WL, the capping layer 30 and the third insulation layer DL3. Data storage element contacts BC penetrating the interlayer insulation layer and the third insulation layer DL3 are formed. The data storage element contacts BC are electrically connected to respective ones the active pillars AP. Data storage elements DS are formed on respective ones of the data storage element contacts BC.

According to an embodiment, the semiconductor devices disclosed in the above exemplary embodiments are encapsulated by various packaging techniques, such as, for example, any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

Figure 13:
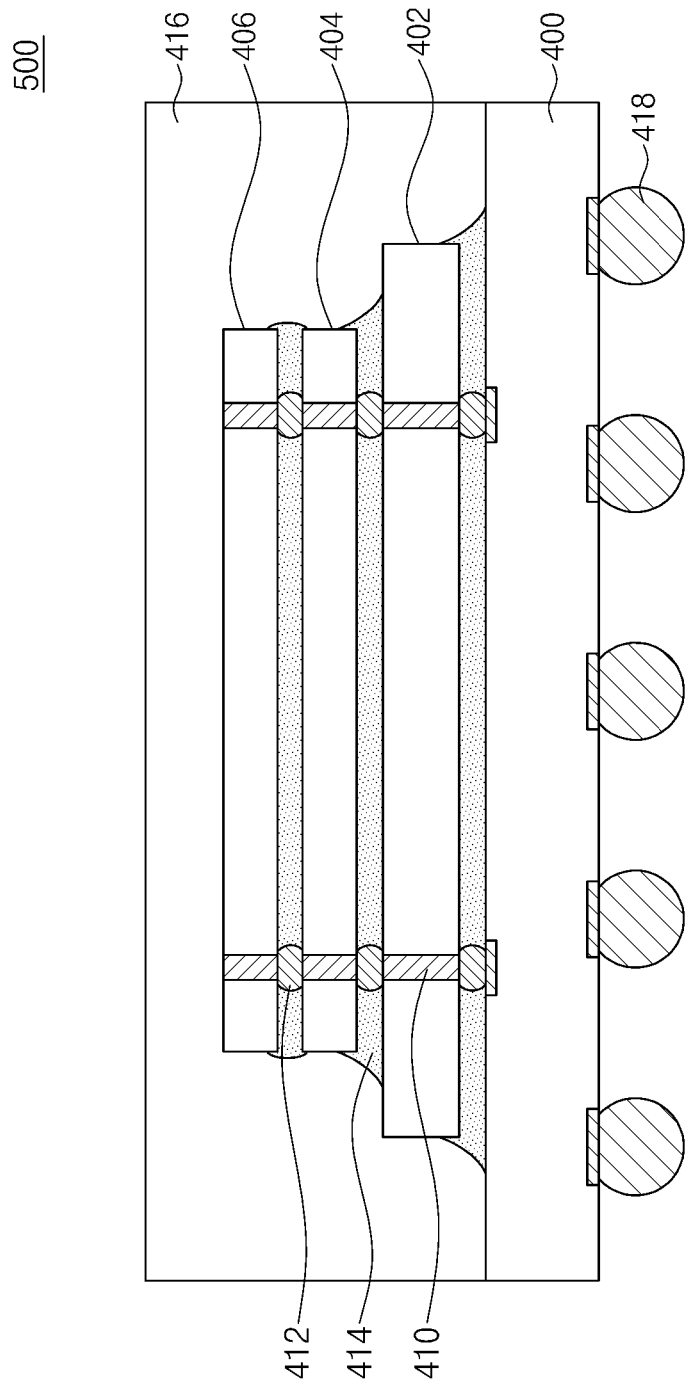
FIG. 13 is a cross sectional view illustrating an example of semiconductor packages including semiconductor devices according to some exemplary embodiments.

FIG. 13 is a cross sectional view illustrating an example of semiconductor packages including semiconductor devices according to some exemplary embodiments.

Referring to FIG. 13, a semiconductor package 500 including semiconductor devices according to an exemplary embodiment includes a package substrate 400, a first semiconductor chip 402, a second semiconductor chip 404 and a third semiconductor chip 406. The first, second and third semiconductor chips 402, 404 and 406 are sequentially stacked on the package substrate 400. According to an embodiment, the second and third semiconductor chips 404 and 406 include memory chips having the same configuration. Alternatively, the second and the third semiconductor chips 404 and 406 include memory chips that have different configurations from each other. Each of the second and third semiconductor chips 404 and 406 corresponds to any one of the semiconductor devices described with reference to FIGS. 1 to 11B. According to an embodiment, the first semiconductor chip 402 includes a logic chip or an interposer. When the first semiconductor chip 402 includes a logic chip, the first semiconductor chip 402 includes a controller and/or logic circuits that control the second and third semiconductor chips 404 and 406. Each of the first, second and third semiconductor chips 402, 404 and 406 includes at least one through silicon via (TSV) 410. Inner bumps 412 and a passivation layer 414 are disposed between the first to third semiconductor chips 402, 404 and 406 and between the first semiconductor chip 402 and the package substrate 400. A molding layer 416 is disposed to cover the first to third semiconductor chips 402, 404 and 406 on a top surface of the package substrate 400. External bumps 418 are disposed on a bottom surface of the package substrate 400. According to an embodiment, the bumps 412 and 418 include, for example, solder balls.

Figure 14:
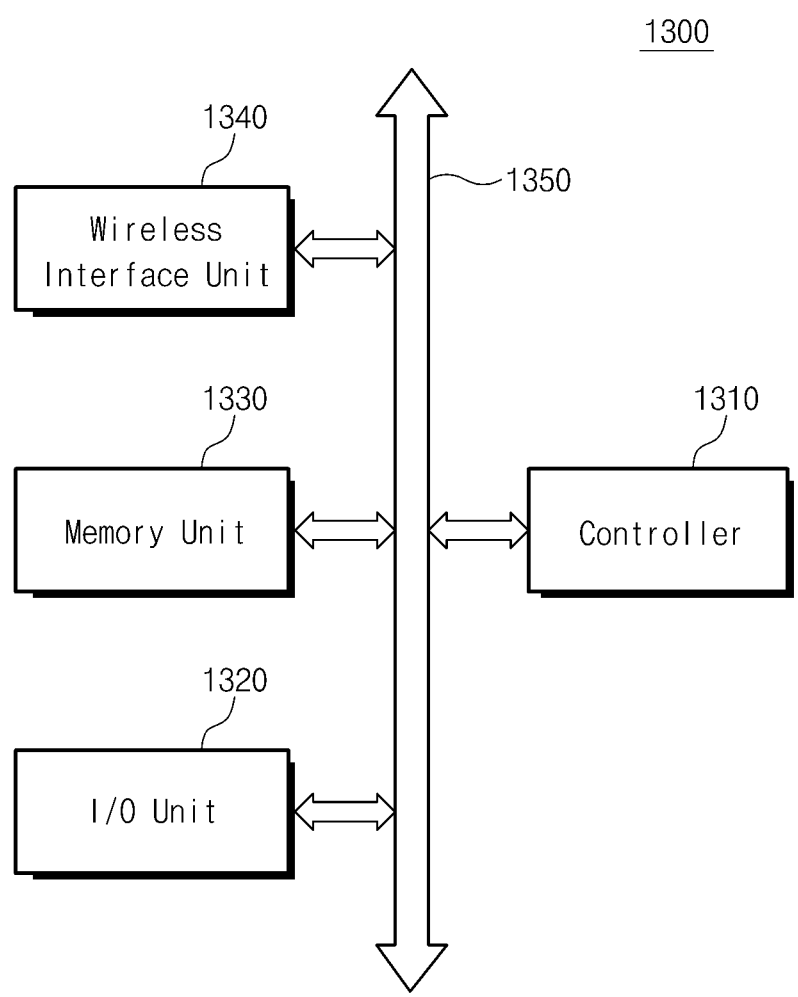
FIG. 14 is a schematic block diagram illustrating an example of an electronic system including a semiconductor device according to an exemplary embodiment.

FIG. 14 is a schematic block diagram illustrating an example of an electronic system including a semiconductor device according to an exemplary embodiment.

Referring to FIG. 14, an electronic system 1300 according to an exemplary embodiment includes one of a personal digital assistant (PDA), a laptop computer, a portable computer, a web tablet, a wireless phone, a mobile phone, a digital music player (MP3 player), an electronic system for wireless or cable communication, and a hybrid electronic system including at least two thereof. The electronic system 1300 includes a controller 1310, an input/output (I/O) unit 1320, a memory unit 1330 and a wireless interface unit 1340 that communicate with each other through a data bus 1350. The I/O unit 1320 includes a key pad, a key board and/or a display unit.

The controller 1310 includes at least one microprocessor, a digital signal processor (DSP), a microcontroller, or the like. The memory unit 1330 stores commands which are executed by the controller 1310. Further, the memory unit 1330 stores user's data. The memory unit 1330 includes at least one of the semiconductor devices according to the embodiments of the inventive concept. The wireless interface unit 1340 is used to transmit information data to a wireless communication network using radio frequency signals or to receive information data from the wireless communication network. For example, the wireless interface unit 1340 includes an antenna for wireless communication or a transceiver for wireless communication. The electronic system 1300 is used in, for example, a third generation communication system, such as, for example, a Code Division Multiple Access (CDMA) system, a Global System for Mobile communication (GSM) system, a North American Digital Cellular (NADC) system, an Extended-Time Division Multiple Access (E-TDMA) system, a Wideband Code Division Multiple Access (WCDMA) system, or a Code Division Multiple Access 2000 (CDMA2000) system.

Figure 15:
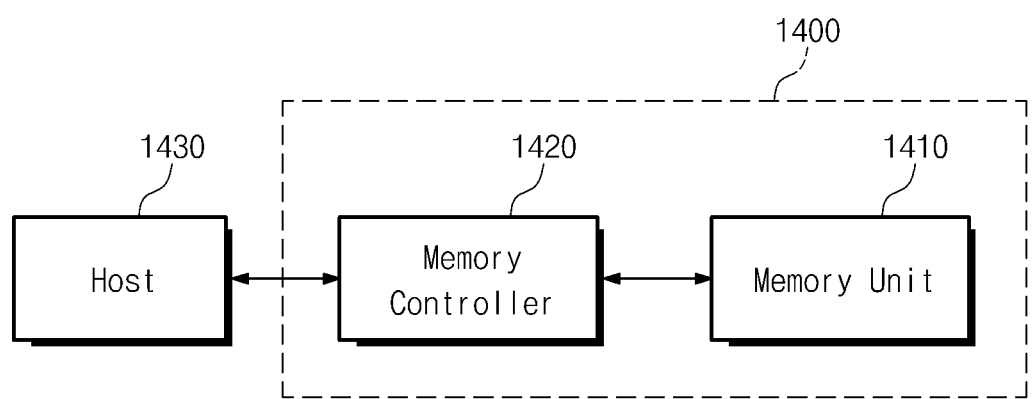
FIG. 15 is a schematic block diagram illustrating an example of a memory system including a semiconductor device according to an exemplary embodiment.

FIG. 15 is a schematic block diagram illustrating an example of a memory system including a semiconductor device according to an exemplary embodiment.

Referring to FIG. 15, a memory system 1400 includes at least one of the semiconductor devices according to the exemplary embodiments described above. The memory system 1400 includes a memory unit 1410 for storing a great amount of data and a memory controller 1420. The memory controller 1420 controls the memory unit 1410 to read out data stored in the memory unit 1410 or to write data into the memory unit 1410 in response to output signals of a host 1430. The memory controller 1420 is configured to include an address mapping table that converts addresses provided from the host 1430, such as a mobile system or a computer system, into physical addresses of the memory unit 1410. The memory unit 1410 includes at least one of the semiconductor devices having the vertical channel transistors according to the aforementioned exemplary embodiments.

According to the embodiments set forth above, a plurality of active pillars are two dimensionally arrayed on a substrate, and each of the active pillars includes a lower dopant region, a channel region and an upper dopant region which are sequentially stacked. The channel regions are connected to each other by a string body connector. The string body connector is used as a path for discharging holes accumulated in the channel regions. For example, the holes accumulated in the channel regions are discharged into an external power supply through the string body connector. Hence, the string body connector can prevent the channel regions from being electrically floated. Accordingly, a leakage current due to an operation of a parasitic bipolar transistor (also referred to as a floating body effect) can be suppressed to improve a data retention characteristic of memory cells including the active pillars and to address a test screen problem.

Buried bit lines are disposed between the active pillars and the substrate, and an insulation layer is disposed between the buried bit lines and the substrate. Thus, the buried bit lines are electrically insulated from the substrate by the insulation layer. Accordingly, the insulation layer can minimize or decrease leakage currents that flow from the buried bit lines toward the substrate.

While the embodiments of the inventive concept have been described, it will be apparent to those skilled in the art that various changes and modifications may be made without departing from the spirit and scope of the inventive concept. Therefore, it should be understood that the above embodiments are not limiting, but illustrative.

What is claimed is:
1. A semiconductor device comprising:
a first insulation layer on a substrate;
a plurality of buried bit lines on the first insulation layer, the buried bit lines extending in a first direction;
a plurality of active pillars on the buried bit lines, at least one of the active pillars including respective lower dopant regions, respective channel regions respectively having first sidewalls, and respective upper dopant regions, wherein the lower dopant regions, the channel regions, and the upper dopant regions are vertically stacked on a corresponding buried bit line of the buried bit lines;

a plurality of contact gate electrodes adjacent to respective ones of the first sidewalls of the channel regions;

a plurality of word lines electrically connected to the contact gate electrodes, the word lines extending in a second direction intersecting the first direction; and a plurality of string body connectors electrically connecting the channel regions to each other, wherein the plurality of string body connectors extend in the second direction.

2. The semiconductor device of claim 1, wherein top surfaces of the string body connectors are coplanar with bottom surfaces of the upper dopant regions, and bottom surfaces of the string body connectors are coplanar with top surfaces of the lower dopant regions.

3. The semiconductor device of claim 1, wherein the string body connectors have the same conductivity type as the channel regions.

4. The semiconductor device of claim 1, wherein the lower dopant regions are two dimensionally arrayed in a plan view and spaced apart from each other.

5. The semiconductor device of claim 1, wherein the lower dopant regions contact top surfaces of the buried bit lines.

6. The semiconductor device of claim 1, wherein the first insulation layer extends to cover sidewalls of the buried bit lines.

7. The semiconductor device of claim 1, wherein each of the string body connectors electrically connects the channel regions to each other, wherein the channel regions are arrayed in a row in the second direction.

8. The semiconductor device of claim 1, further comprising a voltage generator electrically connected to the string body connectors.

9. The semiconductor device of claim 1, further comprising a second insulation layer between the first insulation layer and the substrate.

10. A semiconductor device comprising:

an insulation layer on a substrate;

a buried bit line on the insulation layer, the buried bit line extending in a first direction;

an active pillar on the buried bit line, the active pillar including a lower dopant region, a channel region having a first sidewall, and an upper dopant region, wherein the lower dopant region, the channel region, and the upper dopant region are vertically stacked on the buried bit line;

a contact gate electrode adjacent to the first sidewall of the channel region;

a word line electrically connected to the contact gate electrode, the word line extending in a second direction intersecting the first direction; and a string body connector electrically connected to the channel region, wherein the string body connector extends in the second direction.

11. A semiconductor device comprising:

a substrate;

first and second bit lines on the substrate in parallel with each other, the first and second bit lines extending in a first direction;

a first active pillar on the first bit line, the first active pillar having a first dopant region, a channel region, and a second dopant region sequentially stacked on the first bit line;

a first gate electrode adjacent to the first active pillar along the first direction;

a second active pillar on the second bit line, the second active pillar having a first dopant region, a channel region, and a second dopant region sequentially stacked on the second bit line;

a second gate electrode adjacent to the second active pillar along the first direction, the second gate electrode connected to the first gate electrode; and a string body connector connecting the channel region of the first active pillar with the channel region of the second active pillar, wherein the string body connector extends in a second direction substantially perpendicular to the first direction.

12. The semiconductor device of claim 11, wherein the first and second active pillars are arranged along a second direction perpendicular to the first direction, and the first and second gate electrodes are arranged along the second direction.

13. The semiconductor device of claim 11, further comprising at least one insulation layer between the substrate and the first and second bit lines.

14. The semiconductor device of claim 11, further comprising a gate insulation layer between the first active pillar and the first gate electrode or between the second active pillar and the second gate electrode.

15. The semiconductor device of claim 11, further comprising:

a first data storage element on the second dopant region of the first active pillar; and a second data storage element on the second dopant region of the second active pillar.

16. The semiconductor device of claim 11, wherein the first and second dopant regions of the first or second active pillar are doped with first impurities, and the channel region of the first or second active pillar is doped with second impurities different from the first impurities.

* * * * *